United States Patent
Ishibashi et al.

(10) Patent No.: US 7,459,265 B2
(45) Date of Patent: Dec. 2, 2008

(54) PATTERN FORMING METHOD, SEMICONDUCTOR DEVICE MANUFACTURING METHOD AND EXPOSURE MASK SET

(75) Inventors: Takeo Ishibashi, Tokyo (JP); Takayuki Saito, Tokyo (JP); Maya Itoh, Hyogo (JP); Shuji Nakao, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 598 days.

(21) Appl. No.: 11/255,877

(22) Filed: Oct. 24, 2005

(65) Prior Publication Data

US 2006/0088792 A1 Apr. 27, 2006

(30) Foreign Application Priority Data

Oct. 27, 2004 (JP) ............................. 2004-312076

(51) Int. Cl.
G03F 7/00 (2006.01)
(52) U.S. Cl. ................ 430/311; 430/394; 430/5; 430/322; 430/313; 430/323; 430/330
(58) Field of Classification Search ................ 430/311, 430/394, 5, 322, 313, 323, 330
See application file for complete search history.

(56) References Cited

U.S. PATENT DOCUMENTS

| 5,415,835 | A | 5/1995 | Brueck et al. |
| 5,858,580 | A | 1/1999 | Wang et al. |
| 6,228,539 | B1 | 5/2001 | Wang et al. |
| 6,258,493 | B1 | 7/2001 | Wang et al. |
| 6,351,304 | B1 | 2/2002 | Kawashima et al. |
| 6,566,023 | B2 | 5/2003 | Wang et al. |
| 6,930,754 | B1 | 8/2005 | Sugita et al. |
| 2004/0197680 | A1 | 10/2004 | Wang et al. |

FOREIGN PATENT DOCUMENTS

| JP | 2000-21718 | 1/2000 |
| JP | 2000-349010 | 12/2000 |
| WO | WO99/65066 | 12/1999 |

*Primary Examiner*—Mark F Huff
*Assistant Examiner*—Caleen O Sullivan
(74) *Attorney, Agent, or Firm*—Oblon, Spivak, McClelland, Maier & Neustadt, P.C.

(57) ABSTRACT

First, a first exposure process is performed using dipole illumination with only a grating-pattern forming region as a substantial object to be exposed. Next, a second exposure process is performed with only a standard-pattern forming region as a substantial object to be exposed. A development process is then performed to obtain a resist pattern. A mask for the first exposure process is such that a light blocking pattern is formed on the whole surface of a standard-pattern mask part corresponding to the standard-pattern forming region. A mask for the second exposure is such that a light blocking pattern is formed on the whole surface of a grating-pattern mask part corresponding to the grating-pattern forming region.

13 Claims, 21 Drawing Sheets

F I G . 2
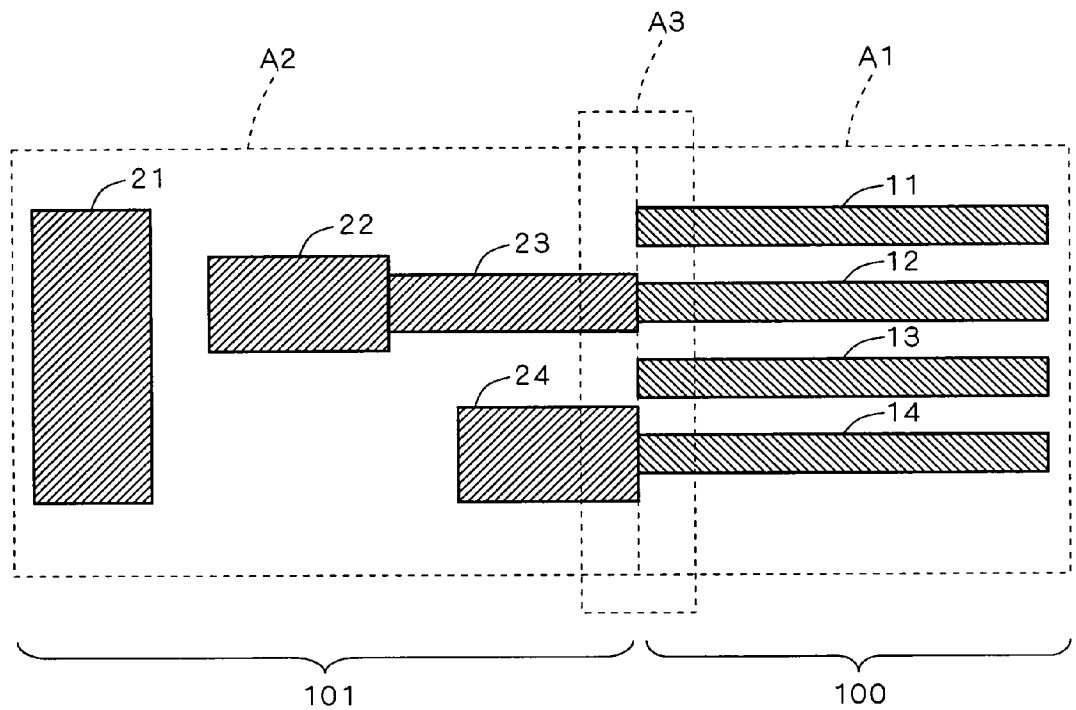
F I G . 3
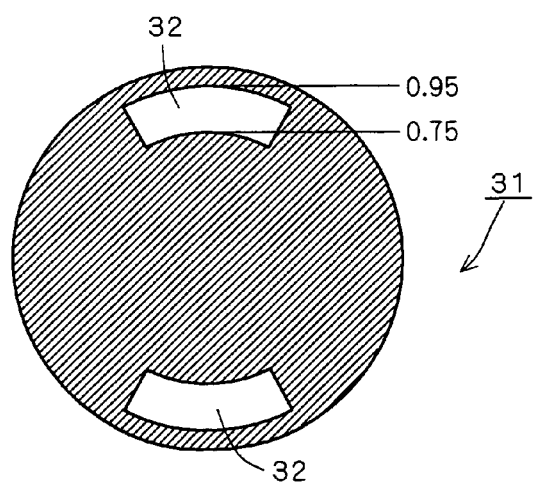

F I G . 1 7
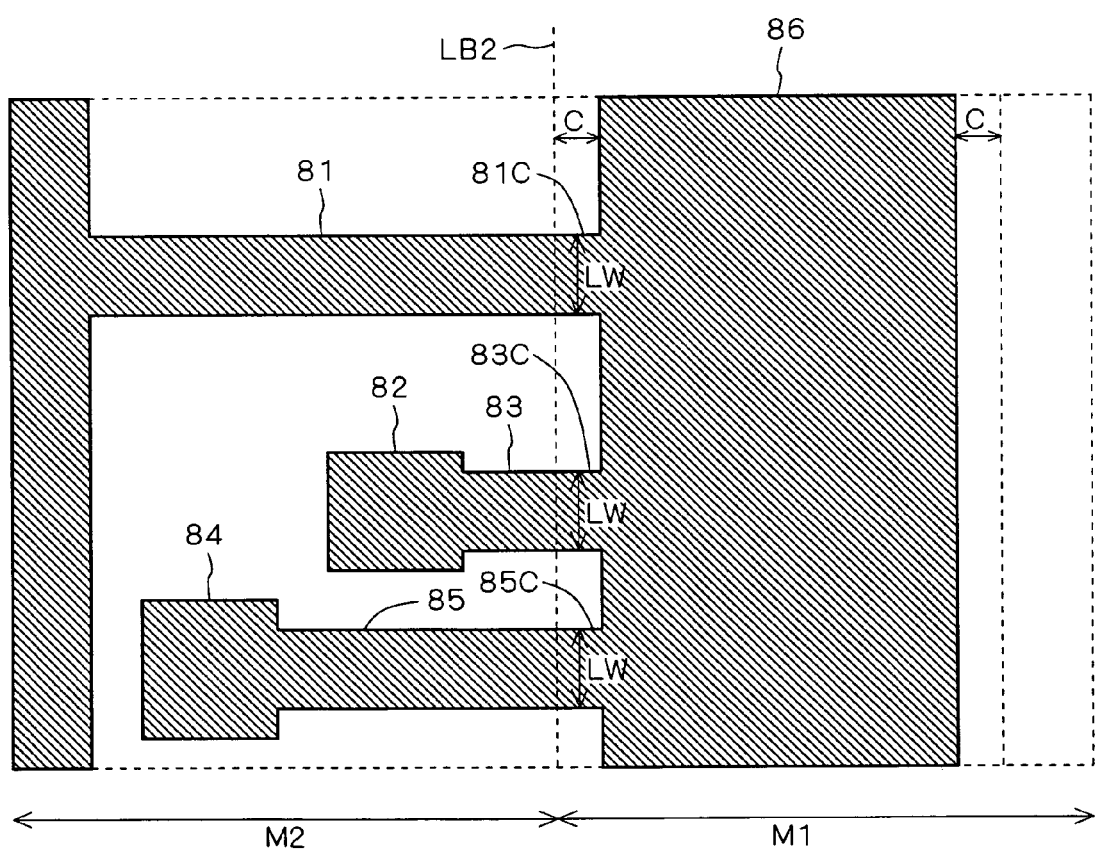

PATTERN FORMING METHOD, SEMICONDUCTOR DEVICE MANUFACTURING METHOD AND EXPOSURE MASK SET

BACKGROUND OF THE INVENTION

1. Field of the Invention

This invention relates to a pattern forming method, and in particular to a resist pattern forming method including both a grating pattern, which is a fine pattern, and a pattern of arbitrary shape, in a lithography step in the course of a process of manufacturing a semiconductor device.

2. Description of the Background Art

The shrinking of semiconductor circuit patterns in recent years is largely attributable to the progress of optical lithography technique, which mainly results from wavelength shortening of an exposure light source. However, ways of shrinking patterns other than the wavelength shortening have been studied in many fields due to price increases in exposure device. For example, as a result of the progress such as enlargement of the aperture of a lens by scanner-type exposure technique, modified illumination technique, super-resolution mask technique or the like, there is a growing trend to shrink manufacturing dimensions of a pattern while maintaining an exposure wavelength. A reversed phenomenon has taken place from a 0.18 μm (180 nm) generation on down in which manufacturing dimensions are less than an exposure wavelength (KrF Excimer laser: 248 nm).

In forming a fine pattern less than the wavelength of light that is used for exposure, techniques using a half-tone phase shift mask, a phase shift mask, and a modified illumination technique are well known. In techniques using the masks, a special mask is used having a portion thereon for inverting the phase of light of an exposure wavelength, for example, to enhance optical intensity contrast on an image-forming surface by an optical interference effect.

In the modified illumination technique, a mask surface is illuminated by optimizing the shape of illumination such that all complicated circuit patterns designed on the mask are formed with stability in dimensions and two-dimensional shapes thereof, to enhance optical intensity contrast of all the patterns on an image-forming surface.

For example, with a fine circuit pattern that includes a pattern (grating pattern (repetition pattern)) in a lattice having fine lines and spaces being repeated alternately, and a pattern (standard pattern) provided to be partly continuous with the grating pattern and to have larger dimensions than the grating pattern, the shape of illumination has been optimized such that excellent optical contrast is obtained for the fine circuit pattern.

A typical example is the optimization of an outer contour radius (outer diameter R1) and an inner contour radius (inner diameter R2) of annular illumination that blocks light circularly at the center of an illumination optical system. The sizes of four openings of four-lens illumination have been optimized as well.

U.S. Pat. No. 5,858,580 discloses forming a fine circuit pattern by a two-exposure process, in which a wiring portion thinner than an exposure wavelength is formed using a phase shift mask and the other portions are formed using a standard mask. This method is being put to practically use.

In addition, U.S. Pat. No. 5,415,835 and Japanese Patent Application Laid-Open No. 2000-349010 disclose forming a fine circuit pattern by a multiple exposure process including a two-exposure process. U.S. Pat. No. 5,415,835 discloses a technique of fabricating a fine pattern by performing a dual beam interference exposure with a device other than standard reduced projection exposure devices. Further, U.S. Pat. No. 5,858,580, Japanese Patent Application Laid-Open No. 2000-349010, U.S. Pat. Nos. 6,228,539, 6,258,493 and 6,566,023, and United States Patent Application Publication No. 2004-197680 disclose a method in which a standard exposure step and a fine isolated wiring pattern (gate pattern) or fine periodic pattern exposure step are performed without intervention of a development process, the fine isolated wiring pattern or fine periodic pattern exposure step being performed using a Levenson type phase shift mask (Alternative Phase Shift Mask) in which phase-inverted complete transmissive areas are juxtaposed to each other. Furthermore, International Patent Application Publication No. WO99/65066 and Japanese Patent Application Laid-Open No. 2000-021718 disclose a method of forming a periodic pattern using dipole illumination, and forming an isolated pattern by erasing the periodic pattern other than a partial wiring in the periodic pattern with a standard pattern by means of exposure.

The following equation (1) is the Rayleigh equation indicative of optical resolution:

$$R = k1 \cdot (\lambda / NA) \tag{1}$$

where R is pattern resolution, $\lambda$ is an exposure wavelength, NA is a lens numerical aperture, and k1 is a process factor.

It is now assumed that a resist pattern for a fine circuit pattern that includes a grating pattern having a process factor k1 of less than "0.3", and a standard pattern having an arbitrary pattern such as fine isolated space and a process factor k1 of "0.5" level, is subjected to patterning. It may be required in some instances that a grating pattern and standard pattern be connected in such resist pattern.

In the conventional techniques described above, it is difficult to resolve this fine circuit pattern with stability no matter how optimized the shape of illumination is. For example, setting the NA to "0.85" with the ArF wavelength (193 nm), the grating pattern of 65 nm L/S will have a process factor k1 of "0.28". In this case, it was extremely difficult even with a phase shift mask technique having a process factor k1 of less than "0.3" to form the fine circuit pattern with high accuracy that includes the fine grating pattern and the arbitrary standard pattern having a process factor k1 of "0.5" level.

This is because when a phase shift mask suitable for the grating pattern is used, a phase mismatch associated with the principle of phase shift mask occurs inevitably due to the pattern arbitrariness, leaving an unintentional and unnecessary pattern on the standard pattern side. Although a negative type resist is commonly used in order to avoid this problem, a resist material having excellent resolution characteristics for the ArF wavelength is nonexistent, and if it does exist, then the resolution between the same phases will inevitably be insufficient due to the circuit structure.

SUMMARY OF THE INVENTION

It is an object of this invention to provide a pattern forming method capable of forming a fine circuit pattern including a grating pattern having a process factor k1 of "0.3" or less and a standard pattern having a process factor k1 of "0.5" level with high accuracy.

In an aspect of this invention, a pattern forming method on a resist formed on a predetermined substrate, with the resist including adjacent first and second regions to be patterned, includes the following steps of: (a) performing a first exposure process with a first exposure mask using dipole illumination substantially on the first region of the resist, the first exposure mask having a repetition pattern in which a line and space are repeated alternately; (b) performing a second exposure process with a second exposure mask substantially on the second region of the resist, the second exposure mask having a standard pattern that is a pattern excluding the repetition pattern, the standard pattern at least partially including a connection pattern continuous with the repetition pattern; and (c) performing a development process on the resist having being subjected to the steps (a) and (b).

An exposure process can be performed that is suitable for each of the first and second regions to be provided with the repetition pattern and standard pattern. The result is that a resist pattern including the repetition pattern and standard pattern that are formed continuously with each other through the connection pattern can be obtained with high accuracy.

In another aspect of this invention, a semiconductor device manufacturing method includes the following steps of: (a) forming a resist on a semiconductor substrate or an object to be patterned inside the semiconductor substrate; (b) patterning the resist using the pattern forming method recited in claim 1; and (c) patterning the object to be patterned with the resist having been patterned as a mask.

The object to be patterned can be patterned with high accuracy.

In another aspect of this invention, an exposure mask set includes first and second exposure masks. The first exposure mask includes adjacent first and second mask parts, the first mask part having a repetition pattern in which a line and space are repeated alternately. The second exposure mask includes first and second mask parts equivalent to the first and second mask parts of the first exposure mask, the second mask part having a standard pattern that is a pattern excluding the repetition pattern, at least part of the standard pattern including a connection pattern for being continuous with the repetition pattern. The first exposure mask is provided with a light blocking region on the whole surface of the second mask part, and the second exposure mask is provided with a light blocking region on at least part of the first mask part. The first and second exposure masks each include a transmissive part, a half-tone phase shift mask part transmitting light only at a predetermined ratio and inverting a phase of light being transmitted therethrough, and a light blocking part having a smaller transmission factor than the predetermined ratio. The second mask part of the first exposure mask is formed at least of the light blocking part in a region excluding a boundary adjacent region between the first and second mask parts. The first mask part of the second exposure mask is formed at least of the light blocking part in a region excluding the boundary adjacent region.

The second mask part excluding the boundary adjacent region blocks light during the first exposure process with the first exposure mask, and the first mask part excluding the boundary adjacent region blocks light during the second exposure process with the second exposure mask.

The result is that no part of the repetition pattern is subjected to light transmission during the second exposure process, allowing the repetition pattern to be obtained with high accuracy. In addition, since no part of the standard pattern is subjected to light transmission during the first exposure process, allowing the standard pattern to be obtained with high accuracy.

These and other objects, features, aspects and advantages of this invention will become more apparent from the following detailed description of this invention when taken in conjunction with the accompanying drawings.

BRIEF DESCRIPTION OF THE DRAWINGS

FIG. 2 illustrates the plane shape of a resist pattern to be finally obtained;

FIG. 3 depicts the structure of an illumination system stop for dipole illumination used in a first exposure process;

FIG. 17 depicts an HT mask for the second exposure process in obtaining the resist pattern shown in FIG. 15;

DESCRIPTION OF THE PREFERRED EMBODIMENTS

First Preferred Embodiment (General Process)

Figure 1:
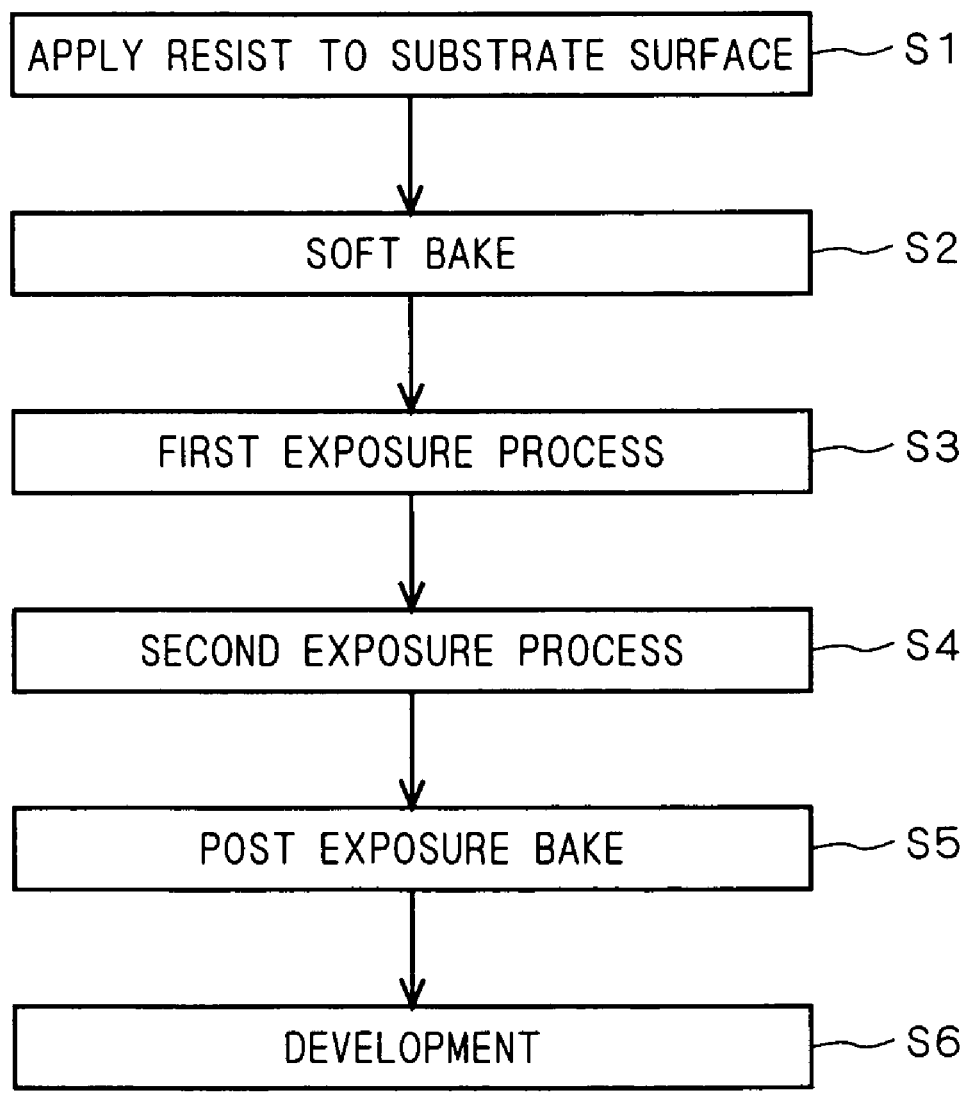
FIG. 1 illustrates a flow chart for a pattern forming method according to a first preferred embodiment of this invention.

FIG. 1 illustrates a flow chart for a pattern forming method according to a first preferred embodiment of this invention. This method will generally be described.

First, at step S1, a resist is applied to the surface of a predetermined substrate. The predetermined substrate as used herein means a substrate having a silicon wafer and a film subject to pattern formation formed thereon such as polysilicon, tungsten, a silicon oxide film, a silicon nitride film or aluminum, or the substrate itself.

The resist application as used herein means, for example, forming an organic anti-reflection film in a thickness of about 78 nm on the predetermined substrate, and applying a methacrylic-system chemically amplified positive type resist in a thickness of about 180 nm on the organic anti-reflection film.

FIG. 2 illustrates the plane shape of a resist pattern (desired pattern) to be finally obtained.

As shown, the desired pattern has a plane shape such that a grating-pattern forming region A1 (first region) where a grating pattern 100 is formed and a standard-pattern forming region A2 (second region) where a standard pattern 101 is formed are separately formed adjacently to each other, while part of the grating pattern 100 and part of the standard pattern 101 are connected in a connection region A3 adjacent to both the regions A1 and A2.

In FIG. 2, line patterns 11 to 14 are arranged in a lattice as the grating pattern 100, and patterns 21 to 24 (21: arbitrary pattern, 22 and 24: pad pattern, 23: wiring pattern) are arranged in arbitrary fashion as the standard pattern 101. The line pattern 12 and wiring pattern 23 are connected, and the line pattern 14 and pad pattern 24 are connected. The "standard pattern" as used in this specification means patterns other than the grating pattern.

Subsequently, at step S2, heat treatment before exposure (soft bake) is performed for about 60 seconds at a temperature of about 110° C., for example.

Next, at step S3, a first exposure process is performed with only the grating-pattern forming region A1 as a substantial object to be exposed. The ArF Excimer laser (wavelength: 193 nm) is used as an exposure light source in this process. This process will be described later in detail.

Next, at step S4, a second exposure process is performed with only the standard-pattern forming region A2 as a substantial object to be exposed. The ArF Excimer laser (wavelength: 193 nm) is used as an exposure light source in this process. This process will be described later in detail.

Then, at step S5, heat treatment after exposure (PEB: Post Exposure Bake) is performed for about 60 seconds at a temperature of about 125° C., for example.

Thereafter, at step S6, a development process is performed to subject the resist to patterning. A 2.38 wt % aqueous solution of tetramethyl ammonium hydroxide may be used as a developer in this process. The result is that the resist is patterned into the desired pattern mentioned above. The development process is followed by heat treatment for dehydration for about 60 seconds at a temperature of about 115° C., for example.

(First Exposure Process)

In the first exposure process, the ArF Excimer laser (wavelength: 193 nm) is used as radiation, for example, and dipole illumination is used as illuminating means.

FIG. 3 depicts the structure of an illumination system stop for dipole illumination used in the first exposure process. The use of dipole illumination with an illumination system stop 31, which is provided with two openings 32, allows for dual beam interference exposure by zero-order diffraction light and first-order diffraction light. The two openings 32 are arranged in a direction in which the lines and spaces of the grating pattern are repeated. That is, when the lines and spaces of the grating pattern 100 are repeated longitudinally (horizontal-striped pattern) as shown in FIG. 2, the openings 32 are arranged at the top and the bottom as shown in FIG. 3.

Figure 4:
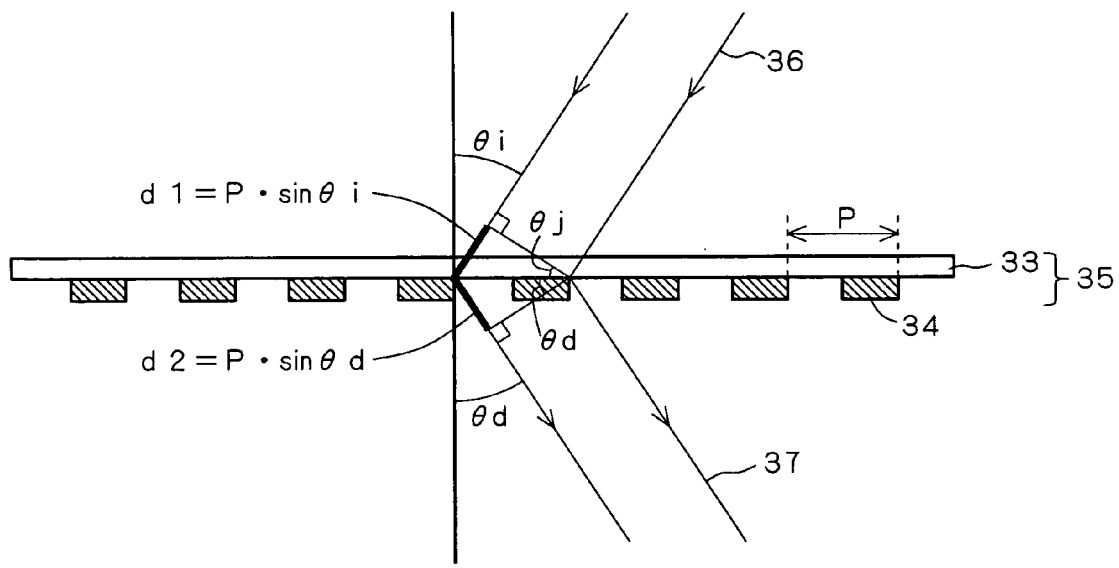
FIG. 4 explains an optical interference condition in the first exposure process.

FIG. 4 explains an optical interference condition in the first exposure process. How ($\lambda$/P) is obtained will be explained with reference to this drawing. In FIG. 4, exposure light 36 enters an HT (half-tone phase shift) mask 35 to be diffracted, the HT mask 35 having a light blocking pattern 34 that form the grating pattern 100 being formed on a glass substrate 33. The exposure light 36 having been diffracted is indicated as exposure light 37.

In this case, an optical path difference $\Delta$ between the exposure lights 36 and 37 is expressed by the following equation (2):

$$\Delta = d1 + d2 = P \cdot (\sin\theta i + \sin\theta d) = \lambda \quad (2)$$

where P is a pitch of the grating pattern, $\theta i$ is an incident angle, $\theta d$ is a diffraction angle, and as mentioned above, $\lambda$ is an exposure wavelength. The equation (2) tells that an ideal optical interference condition will be attained when $(\lambda \div P) = \sin\theta i + \sin\theta d$.

Here, on conditions of $\lambda = 193$ nm, NA=0.85, P=130 nm (grating pattern in which spaces and lines are arranged with 65 nm-pitches), and iNA=0.81, inner sigma $\sigma$in and outer sigma $\sigma$out are obtained by applying $(\lambda \div P)$ obtained from the above equation (2) to the following equations (3) and (4). The iNA is an illumination numerical aperture of an exposure device, and NA is a numerical aperture of a projection lens.

$$\sigma in = \{(\lambda/P) - NA\}/NA \quad (3)$$

$$\sigma out = iNA/NA \quad (4)$$

The result is that the inner sigma $\sigma$in and outer sigma $\sigma$out of the openings 32 shown in FIG. 3 are obtained as "0.75" and "0.95", respectively.

An increase in cutting angle of circular arcs of the openings 32 of the illumination system stop 31 for dipole illumination shown in FIG. 3 will result in deterioration of contrast, but enhancement of illumination. Accordingly, an optimum value for the cutting angle is selected based on a trade-off between them.

In addition, it will be appreciated that the openings 32 could have other shapes than that in FIG. 3 as long as they satisfy the above optical interference condition.

Figure 5:
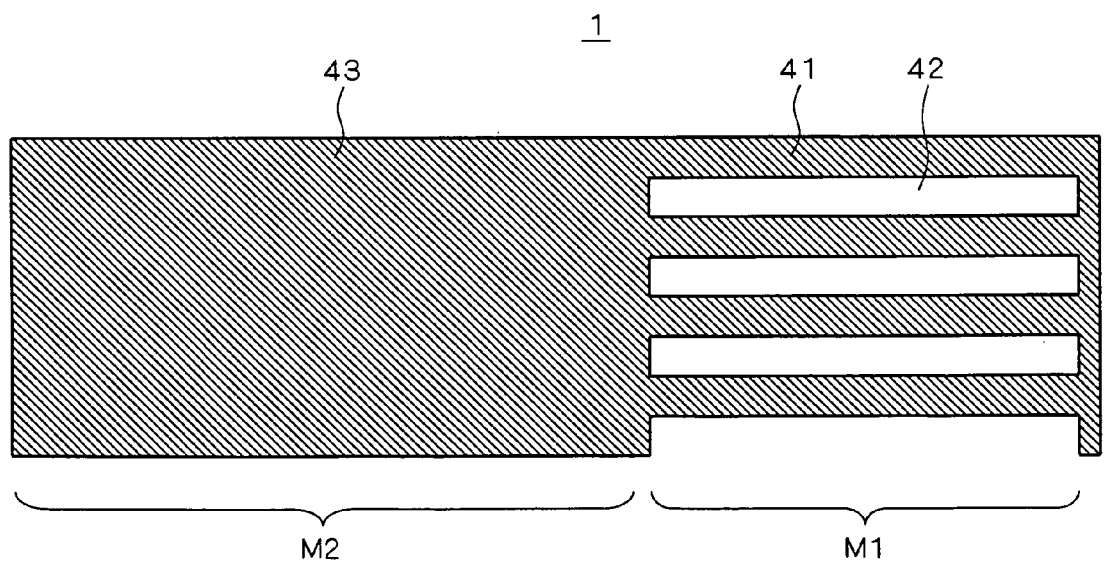
FIG. 5 illustrates the plane shape of an HT mask used in the first exposure process.

FIG. 5 illustrates the plane shape of an HT mask used in the first exposure process. As shown, an HT mask 1 for the first exposure is such that a light blocking pattern 41 and transmissive pattern 42 are formed alternately on a grating-pattern mask part M1 (first mask part) corresponding to the grating-pattern forming region A1, and a light blocking pattern 43 is formed on the whole surface of a standard-pattern mask part M2 (second mask part) corresponding to the standard-pattern forming region A2. The light blocking pattern 41 is provided to form the line patterns 11 to 14 shown in FIG. 2. The light blocking patterns 41 and 43 of the HT mask 1 have a transmission factor of 6%.

An HT (half-tone phase shift) mask is described. An HT mask includes a transmissive part (which corresponds to the transmissive pattern 42) transmitting high intensity light that contributes to exposure, and a light blocking part (which corresponds to the light blocking pattern 41) having a transmission factor of about 6% and inverting the phase of light being transmitted. The adoption of an exposure technique with such HT mask allows for contrast enhancement on an image-forming surface.

With the dipole illumination using the HT mask 1, the first exposure process is performed with only the grating-pattern forming region A1 as a substantial object to be exposed.

(Second Exposure Process)

Figure 6:
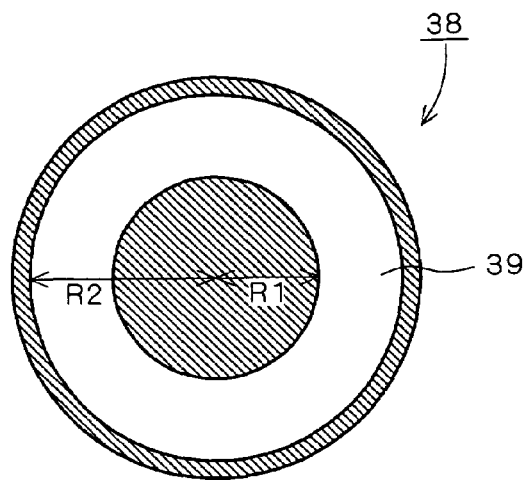
FIG. 6 depicts the structure of an illumination system stop for ⅔ annular illumination used in a second exposure process.

FIG. 6 depicts the structure of an illumination system stop for ⅔ annular illumination used in the second exposure process. As shown, an illumination system stop 38 includes an annular opening 39, with the ratio between an inner diameter R1 from the center to the opening 39 and an outer diameter R2 from the center to the opening 39 being set to 2:3. The use of the illumination system stop 38 thus allows for ⅔ annular illumination. The numerical aperture NA is set to "0.85". Exposure conditions in the second exposure process including the amount of irradiation and a focus position are respectively optimized.

Figure 7:
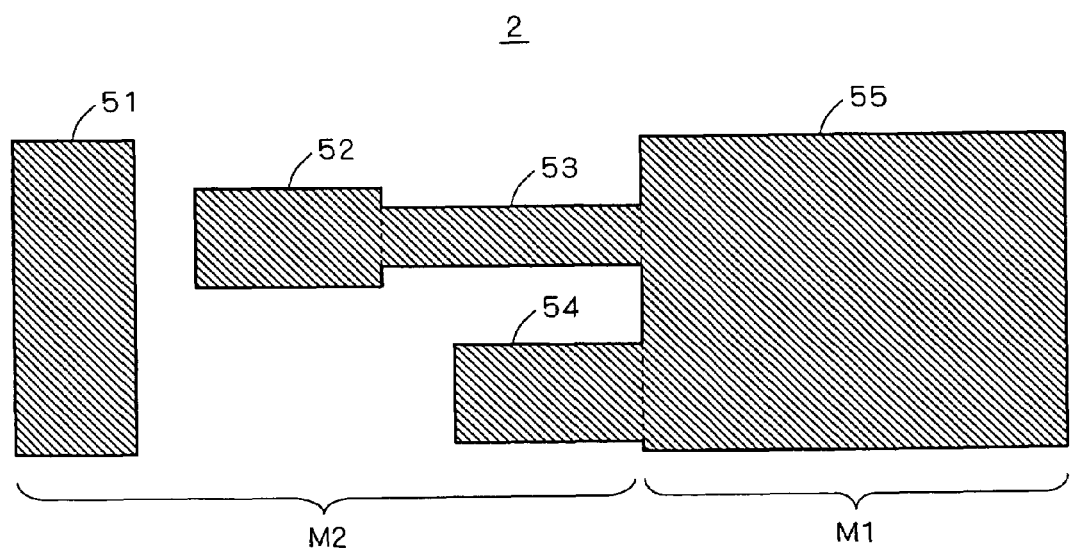
FIG. 7 illustrates the plane shape of an HT mask used in the second exposure process.

FIG. 7 illustrates the plane shape of an HT mask used in the second exposure process. As shown, an HT mask 2 for the second exposure is such that a light blocking pattern 55 is formed on the whole surface of the grating-pattern mask part M1, and light blocking patterns 51 to 54 are formed on the standard-pattern mask part M2. In the standard-pattern mask part M2, a region where the light blocking patterns 51 to 54 are not formed is a transmissive region. The light blocking patterns 51 to 54 are provided to form the patterns 21 to 24 of the standard pattern 101 shown in FIG. 2.

With the ⅔ annular illumination using the HT mask 2, the second exposure process is performed with only the standard-pattern forming region A2 as a substantial object to be exposed.

Therefore, in the first preferred embodiment, an exposure mask set including the HT mask 1 for the first exposure and HT mask 2 for the second exposure is used so that a pattern including the grating pattern 100 and standard pattern 101 can be formed on the resist with high accuracy.

(Effect)

As has been described, the desired pattern shown in FIG. 2 is obtained by the pattern forming method according to the first preferred embodiment. Observation by an electron microscope of the resist pattern obtained by this pattern forming method confirmed that a pattern including a grating pattern of 65 nm L/S and a peripheral circuit pattern which is a standard pattern that are formed continuously with each other, just like the desired pattern shown in FIG. 2, had been resolved.

As described above, in the pattern forming method according to the first preferred embodiment, the first exposure process for forming the grating pattern is performed with only the grating-pattern forming region A1 as a substantial object to be exposed, by using dipole illumination suitable for exposure of a fine pattern (having a process factor k1 of 0.3 or less, for example). In addition, the second exposure process for forming the standard pattern is performed with only the standard-pattern forming region A2 as a substantial object to be exposed, by using isotropic illumination such as annular illumination suitable for exposure of a standard pattern. Namely, the two-exposure process constitutes an optimum exposure process to obtain the desired pattern shown in FIG. 2.

Accordingly, a resist pattern for a circuit pattern that includes both a grating pattern having a process factor k1 of less than "0.3", and a standard pattern having a process factor k1 of 0.5 level can be obtained with high accuracy.

The formation with high accuracy of a circuit pattern in which a grating pattern and standard pattern are formed separately while being continuous with each other allows for the designs of circuit patterns having various kinds of shapes.

In addition, in the pattern forming method according to the first preferred embodiment, the light blocking pattern 43 is provided on the whole surface of the standard-pattern mask part M2 during the first exposure process, and the light blocking pattern 55 is provided on the whole surface of the grating-pattern mask part M1 during the second exposure process, so that exposure can be performed only on the grating-pattern forming region A1 in the first exposure process and only on the standard-pattern forming region A2 in the second exposure process. This attains optimum exposure for each of the grating pattern 100 and standard pattern 101 formed on the grating-pattern forming region A1 and standard-pattern forming region A2, respectively.

The pattern forming method according to the first preferred embodiment is also a cost-effective method, because it is performed using the existing exposure devices and the like, so no new exposure devices and the like need to be additionally introduced when performing the first and second exposure processes.

The sequence of the first and second exposure processes may be reversed. Namely, the first exposure process may be performed after the second exposure process.

Further, although the resist is exposed to the standard pattern by a single exposure step in the second exposure process according to the first preferred embodiment, the resist may be exposed to the standard pattern by two or more partial exposure steps in the second exposure process. The number of partial exposure steps will be selected in arbitrary fashion depending on the shape of standard pattern, for example.

When performing a plurality of partial exposure steps in the second exposure process, the amount of irradiation and an exposure focus position may naturally be optimized in each partial exposure step. Such optimizations may be performed in the first exposure process as well, as mentioned above.

Thus, appropriate exposure conditions may be set for each pattern to be formed in each partial exposure step in the second exposure process that includes the plurality of partial exposure steps. This allows for resolution enhancement of the whole pattern in order to obtain a desired pattern such as is shown in FIG. 2.

(Modification)

The pattern forming method according to the first preferred embodiment concerns a pattern including a grating pattern in which lines and spaces are repeated only in one direction and a standard pattern. As a modification, exposures are performed based on the assumption that a grating pattern (lines and spaces) is repeated in two directions (first and second directions orthogonal to each other), namely, a grating pattern includes a first partial grating pattern in which lines and spaces are repeated alternately in the above first direction and a second partial grating pattern separately formed in which lines and spaces are repeated alternately in the above second direction.

In this case, it is effective to change a illumination condition of dipole illumination when forming the first and second partial grating patterns by rotating the stops of dipole illumination shown in FIG. 3 by 90 degrees. That is, the patterns will be formed on the resist by the following steps:

First, as a first step of the first exposure process for grating pattern, an exposure process is performed under a first illumination condition with the dipole illumination stops in which the two openings 32 are arranged in the above first direction, using a first partial grating pattern mask having the first partial grating pattern.

Next, as a second step of the first exposure process for grating pattern, an exposure process is performed under a second illumination condition with the dipole illumination stops in which the two openings 32 are arranged in the above second direction, using a second partial grating pattern mask having the second partial grating pattern.

Then, as a step of the second exposure process, an exposure process is performed under a third illumination condition with isotropic illumination such as annular illumination, using an exposure mask having the standard pattern that includes a connection portion to the grating pattern.

Lastly, the resist is subjected to development.

In this manner, the first and second partial grating patterns are subjected to exposure under different illumination conditions having different contents of the dipole illumination stops, thus setting an optimum illumination condition for each of the first and second exposure processes. Accordingly, a fine pattern that includes a grating pattern (first and second partial grating patterns) having a process factor k1 of 0.3 or less both longitudinally and horizontally can be formed with high accuracy.

Second Preferred Embodiment (Premise)

The finally obtained grating pattern by the pattern forming method according to the first preferred embodiment is thinner than a resist pattern immediately after the first exposure process, and vertically deteriorated in resist shape. This is possibly the consequence of being subjected to half-tone transmitted light (light being transmitted through the light blocking pattern 55) during the second exposure process. As a result, the contrast in a composite optical image of the mask for the first exposure and mask for the second exposure deteriorates, further causing deterioration in line edge roughness (straightness of wiring). Improvements are made to these deteriorations in a second preferred embodiment of this invention.

(General Process)

A general process is performed in the same fashion as the first preferred embodiment illustrated in FIG. 1, except the contents of the second exposure process at step S4.

(Study of Various Problems)

Figure 8:
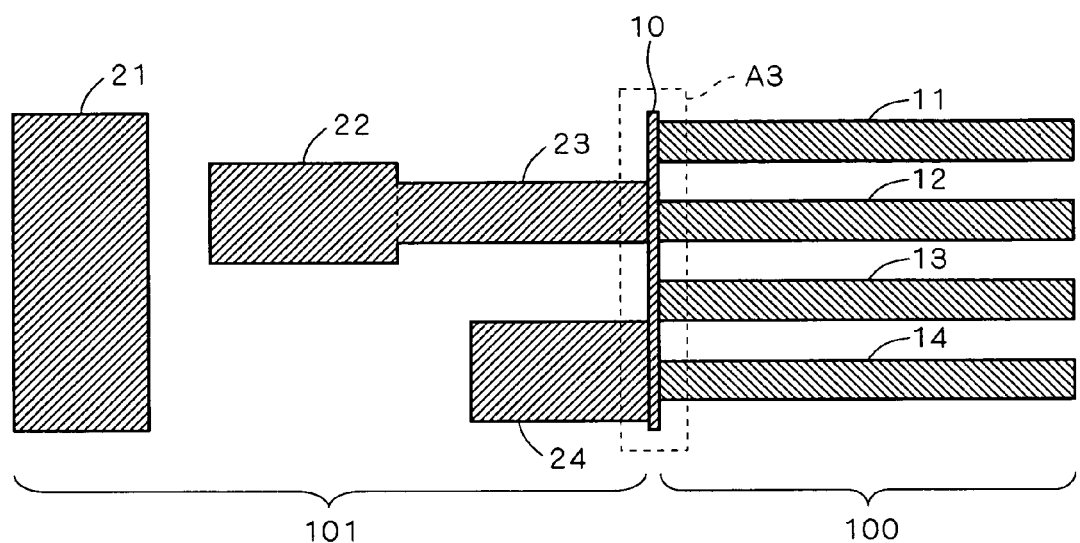
FIG. 8 illustrates a resist pattern formed when a mask for the first exposure process is overlaid on the mask for the second exposure process with a deviation in a rightward-slanting rear direction.

FIG. 8 illustrates a resist pattern formed when the mask for the first exposure process is overlaid on the mask for the second exposure process with a deviation in a rightward-slanting rear direction. Formed as a result between the grating pattern 100 and standard pattern 101 is an unnecessary pattern 10 that connects the line patterns 11 to 14 and the wiring patterns 23 and 24. A short circuit will disadvantageously occur between the line pattern 11 and the line pattern 12 (wiring pattern 23) when set to different potentials.

Figure 9:
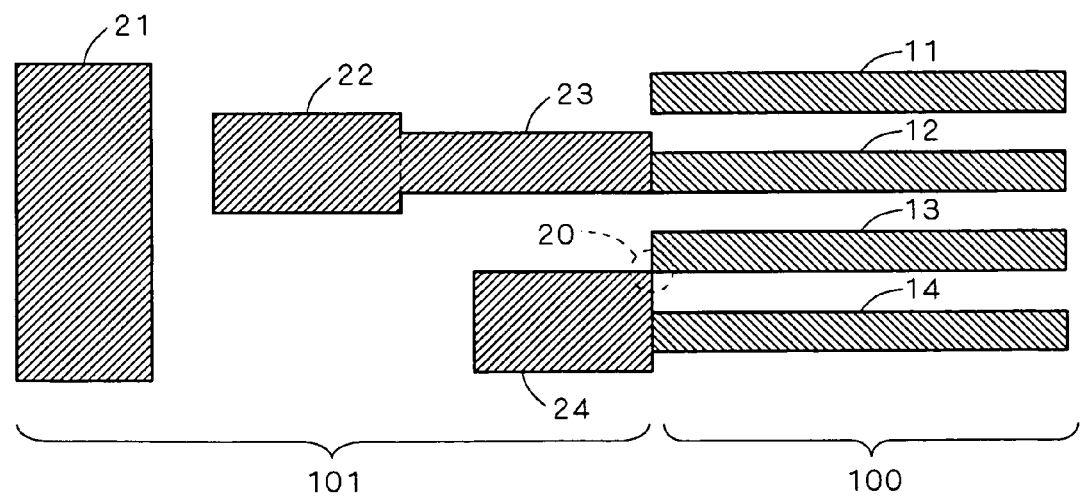
FIG. 9 illustrates a resist pattern formed when the mask for the first exposure process is overlaid on the mask for the second exposure process with a deviation in a leftward-slanting rear direction.

FIG. 9 illustrates a resist pattern formed when the mask for the first exposure process is overlaid on the mask for the second exposure process with a deviation in a leftward-slanting rear direction. As a result, the line pattern 13 and pad pattern 24 get unnecessarily connected.

Figure 10:
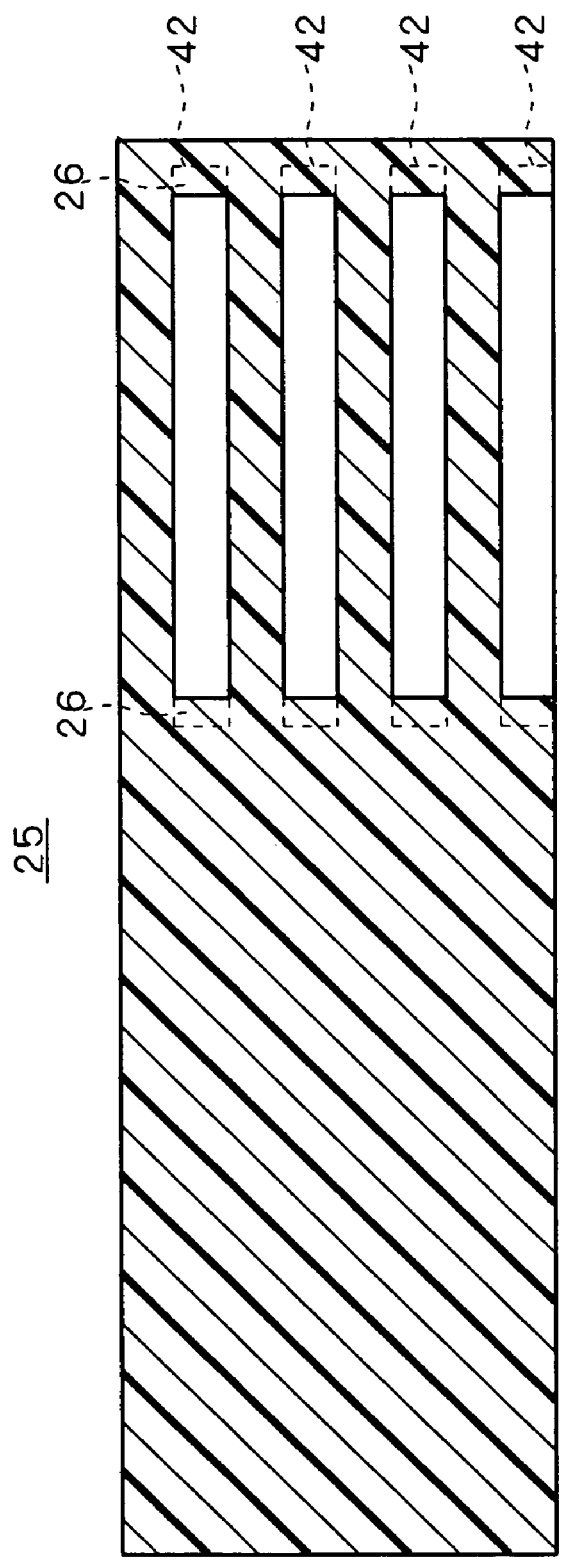
FIG. 10 illustrates the plane structure of an imaginary resist pattern focusing only on a grating pattern.

FIG. 10 depicts the plane structure of an imaginary resist pattern focusing only on a grating pattern. An imaginary resist pattern 25 as shown is assumed to be obtained after being subjected to the first exposure process using the HT mask 1 shown in FIG. 5, and then a development process. In the imaginary resist pattern 25, as shown in FIG. 10, grating pattern edges corresponding to the transmissive patterns 42 shown in FIG. 5 recede (an edge recession phenomenon occurs) from the mask dimensions on the optical principle caused by the shape of pattern, leaving recession residual patterns 26.

Figure 11:
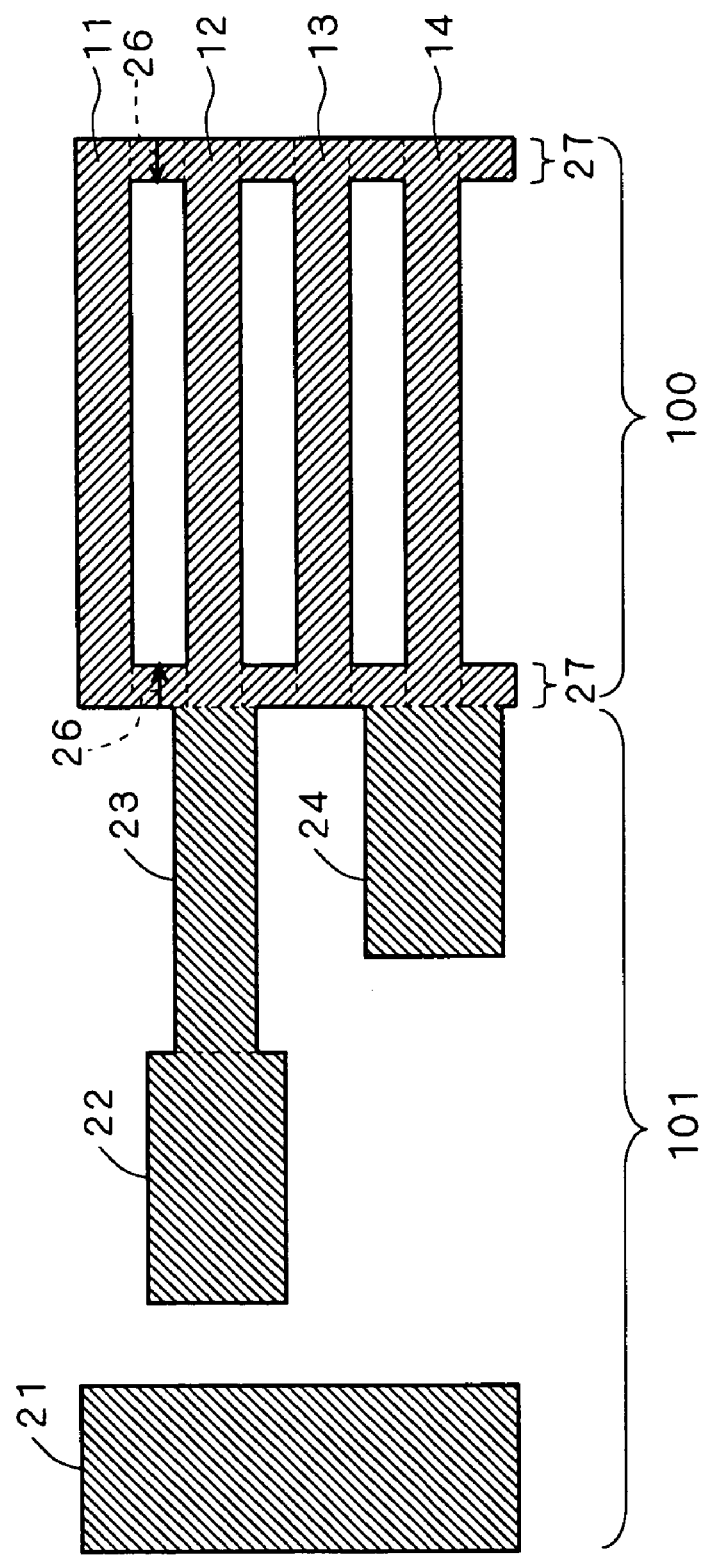
FIG. 11 illustrates the plane structure of an assumed resist pattern in view of an edge recession phenomenon shown in FIG. 10.

FIG. 11 depicts the plane structure of an assumed resist pattern in view of the edge recession phenomenon shown in FIG. 10. As shown, the recession residual patterns 26 connects the line patterns 11 and 12, 12 and 13, and 13 and 14, to form an unnecessary electric connection pattern 27 on each side of the line patterns 11 to 13. The unnecessary electric connection pattern 27 is disadvantageously further connected to the wiring pattern 23 and pad pattern 24. As such, problems arise not only by the deviations of masks as shown in FIGS. 8 and 9, but also by the edge recession phenomenon shown in FIG. 10.

(Second Exposure Process)

In view of the various problems mentioned above, improvements are made to the HT mask used in the second exposure process according to the second preferred embodiment.

Figure 12:
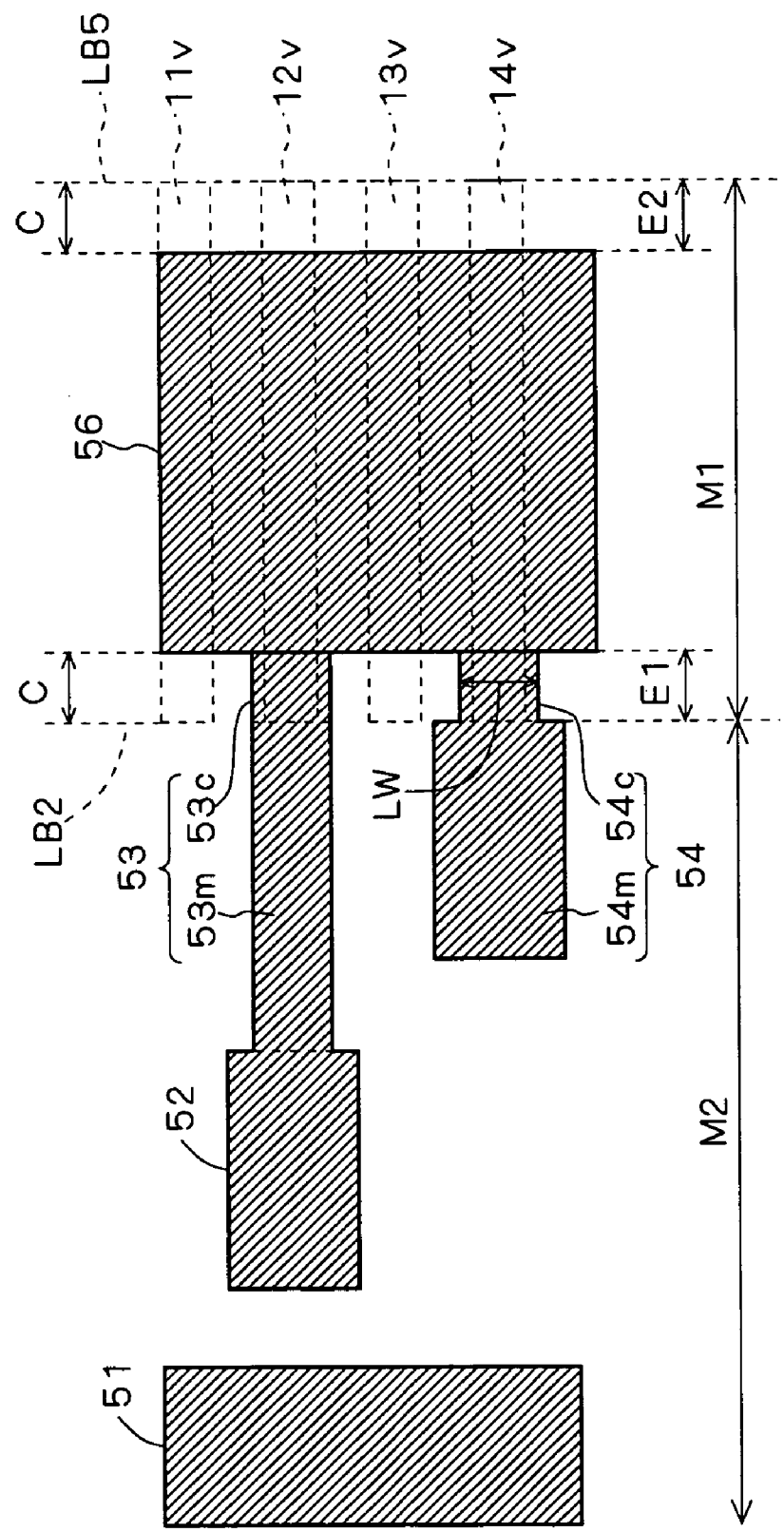
FIG. 12 illustrates the plane structure of an HT mask used in the second exposure process according to a second preferred embodiment of this invention.

FIG. 12 illustrates the plane structure of an HT mask used in the second exposure process according to the second preferred embodiment.

As shown, an HT mask 4 for the second exposure is such that a reduced light blocking pattern 56 that is reduced by a predetermined amount C from each side of the light blocking pattern 55 of the HT mask 2 shown in FIG. 7 is formed on the grating-pattern mask part M1. That is, the reduced light blocking pattern 56 is formed on the grating-pattern mask part M1 except an extension region E1 (first extension region) extending from a boundary line LB2 between the grating-pattern mask part M1 and the standard-pattern mask part M2 toward the grating-pattern mask part M1 side by the predetermined amount C (first predetermined amount), and an extension region E2 (second extension region) extending inwardly from an edge line LB5 by the predetermined amount C (second predetermined amount).

The extension region E2 is thus a transmissive region. Imaginary line patterns 11v to 14v are indicated by dashed lines in order to clarify the size of the reduced light blocking pattern 56. The edge line LB5 corresponds to edge positions of the imaginary line patterns 11v to 14v.

Meanwhile, a light blocking pattern 53 of the HT mask 4 includes the light blocking pattern 53 of the HT mask 2 shown in FIG. 7, and additionally a light blocking pattern extension part 53c extending toward the (inside of) grating-pattern mask part M1 side in the extension region E1, while a light blocking pattern 54 includes the light blocking pattern 54 of the HT mask 2 shown in FIG. 7, and additionally a light blocking pattern extension part 54c extending toward the grating-pattern mask part M1 side in the extension region E1. That is, the extension parts 53c and 54c of the light blocking patterns 53 and 54 serving as connection patterns of the standard pattern 101 are provided in the extension region E1.

As such, in the HT mask 4 used in the second exposure process according to the second preferred embodiment, the light blocking pattern 53 includes a light blocking pattern main part 53m (which corresponds to the light blocking pattern 53 of the HT mask 2) and the light blocking pattern extension part 53c that are formed continuously with each other, while the light blocking pattern 54 includes a light blocking pattern main part 54m (which corresponds to the light blocking pattern 54 of the HT mask 2) and the light blocking pattern extension part 54c that are formed continuously with each other.

The predetermined amount C is determined based on the amount of recession due to the edge recession phenomenon, and a tolerance of the overlay deviation (simple sum of the amount of recession and the tolerance of the overlay deviation, for example).

A wiring width LW of the light blocking pattern extension parts 53c and 54c is determined as follows: when a line dimension of the grating pattern is set to 65 nm, for example, a simple sum of a overlay tolerance of 15 nm (vertical and horizontal directions in the plane structure shown in FIG. 12) and a dimensional accuracy tolerance of 10 nm (tolerance of finished dimensional deviation) leads to the wiring width LW of 115 nm. The tolerances may be obtained by a simple sum or by a root sum square. The dimensions of wiring with a thickness tolerance as defined herein should not be regarded as design dimensions of a mask, but may be regarded as the dimensions of a resist pattern obtained after exposure and development.

As described above, in the pattern forming method according to the second preferred embodiment, the second exposure process is performed using the HT mask 4 instead of the HT mask 2 of the first preferred embodiment.

(Effect)

Figure 13:
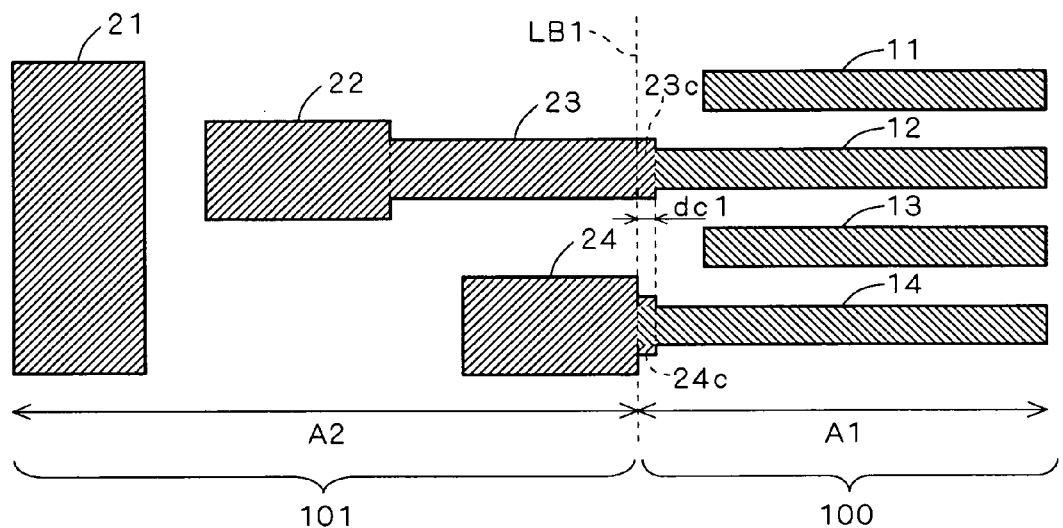
FIGS. 13 to 15 illustrate resist patterns obtained by pattern forming methods according to the second preferred embodiment.

FIG. 13 illustrates a resist pattern obtained by the pattern forming method according to the second preferred embodiment, where the edge recession phenomenon occurs with an amount of recession dc1 (<C).

As described above, the HT mask 4 includes the reduced light blocking pattern 56 reduced by the predetermined amount C, and the light blocking pattern extension parts 53c and 54c extending by the predetermined amount C, from the boundary line LB2 toward the grating-pattern mask part M1 side. Accordingly, the unnecessary electric connection patterns 27 (see FIG. 11) not located under the light blocking pattern extension parts 53c and 54c are completely erased during the second exposure process.

The result is that wiring pattern extension parts 23c and 24c are formed extending from a boundary line LB1 between the grating-pattern forming region A1 and the standard-pattern forming region A2 toward the grating-pattern forming region A1 side only by the amount of recession dc1, as shown in FIG. 13. The wiring pattern extension part 23c connects the wiring pattern 23 and line pattern 12, and the wiring pattern extension part 24c connects the pad pattern 24 and line pattern 14. Therefore, a pattern equivalent to the FIG. 2 pattern in terms of electrical connection relationship is obtained even in the event of the edge recession phenomenon.

Figure 14:
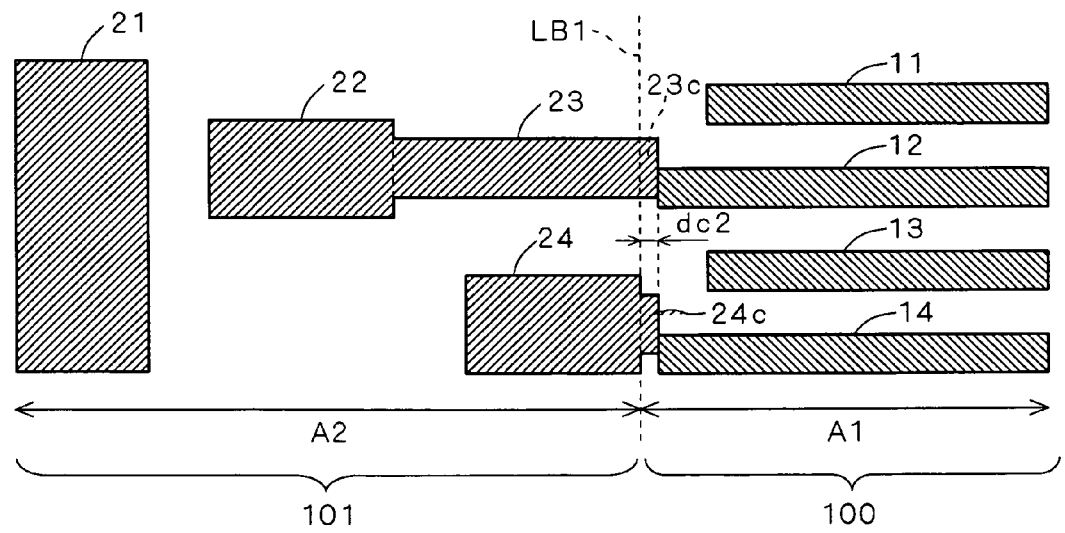

FIG. 14 illustrates a resist pattern obtained by the pattern forming method according to the second preferred embodiment, where the mask overlay deviation phenomenon in a rightward-slanting direction occurs with an amount of deviation dc2 (<C) to the right (direction in which the line pattern 11 is formed (first direction)).

As described above, the HT mask 4 includes the reduced light blocking pattern 56, and the light blocking pattern extension parts 53c and 54c. Accordingly, the unnecessary pattern 10 (see FIG. 8) not located under the light blocking pattern extension parts 53c and 54c is completely erased during the second exposure process.

The result is that wiring pattern extension parts 23c and 24c are formed extending from the boundary line LB1 toward the grating-pattern forming region A1 side only by the amount of deviation dc2, as shown in FIG. 14. The wiring pattern extension part 23c connects the wiring pattern 23 and line pattern 12, and the wiring pattern extension part 24c connects the pad pattern 24 and line pattern 14. Therefore, a pattern equivalent to the FIG. 2 pattern in terms of electrical connection relationship is obtained even in the event of the mask overlay deviation phenomenon in a rightward-slanting direction.

Moreover, because the wiring width LW of the light blocking pattern extension parts 53c and 54c is set wider than the forming width of the line patterns 11 to 14 in view of the overlay tolerance and dimensional accuracy tolerance, the line pattern 12 and wiring pattern extension part 23c, and the line pattern 14 and wiring pattern extension part 24c can respectively be connected with reliability even in the event of a overlay deviation in a vertical direction (second direction).

In this manner, in the pattern forming method according to the second preferred embodiment, the second exposure process is performed using the HT mask 4 shown in FIG. 12, thus forming a resist pattern free from problems even in the event of the edge recession phenomenon, mask overlay deviation phenomenon, and so on.

Figure 15:
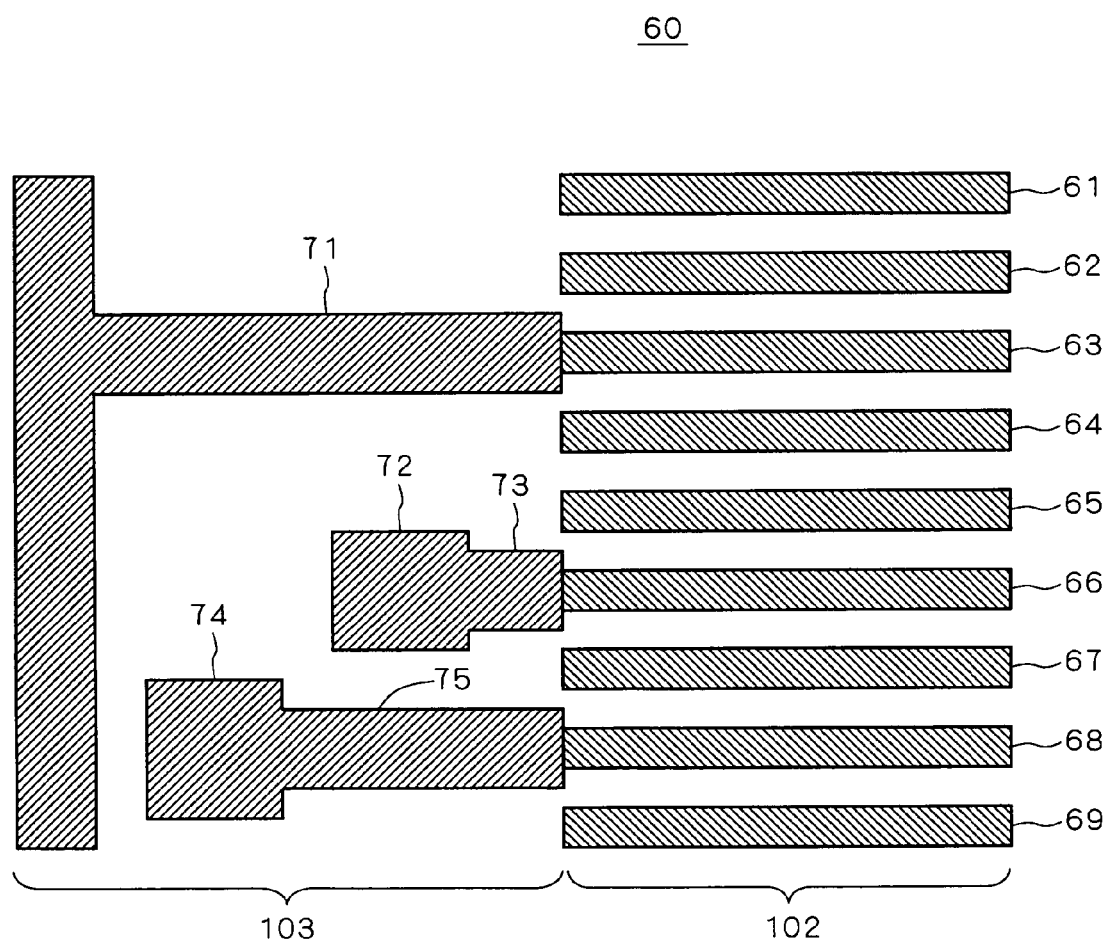

FIG. 15 illustrates a resist pattern formed by the pattern forming method according to the second preferred embodiment. As shown, a grating pattern 102 including line patterns 61 to 69 and a standard pattern 103 including patterns 71 to 75 are formed adjacently to each other as a desired pattern. The wiring pattern 71 and line pattern 63, the wiring pattern 73 and line pattern 66, and the wiring pattern 75 and line pattern 68, are respectively continuous with each other.

Figure 16:
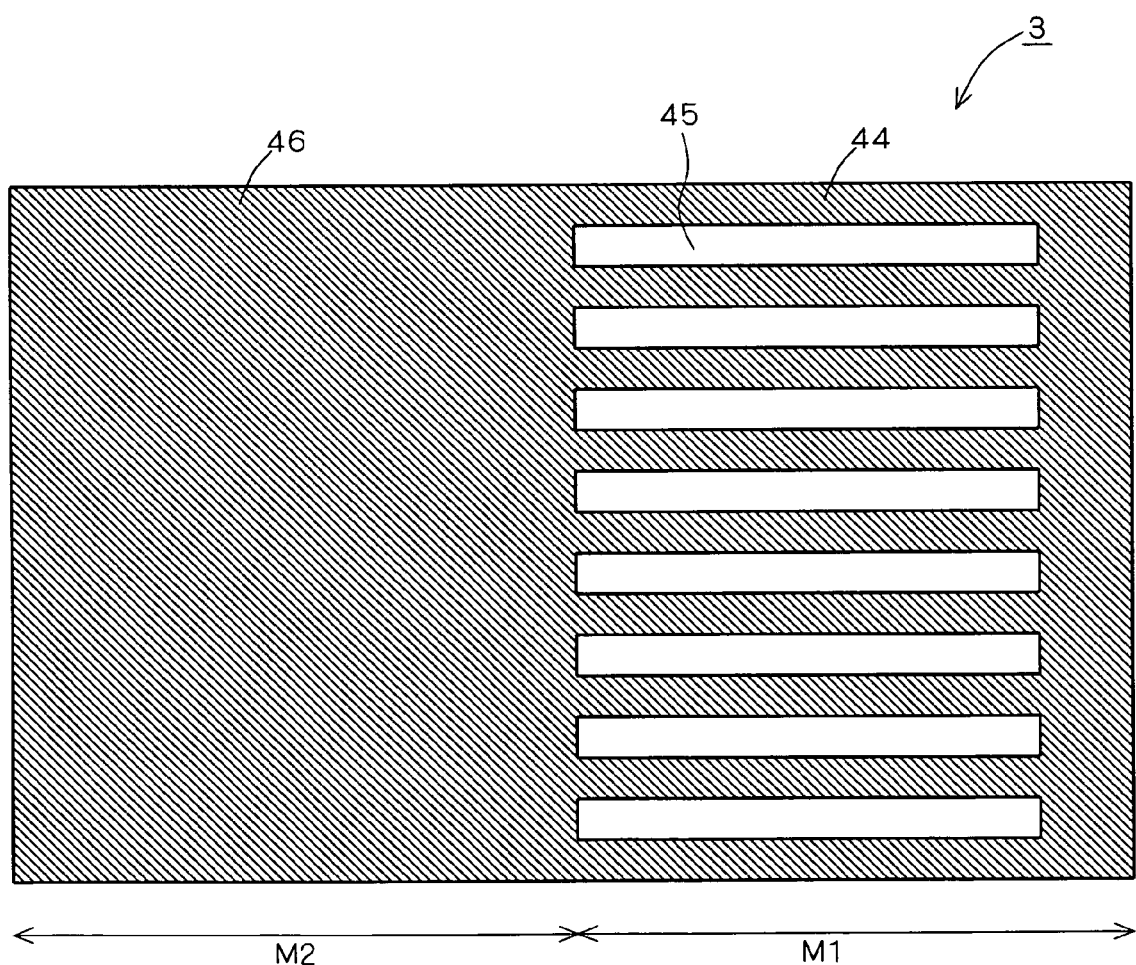
FIG. 16 illustrates an HT mask for the first exposure process in obtaining the resist pattern shown in FIG. 15.

FIG. 16 illustrates an HT mask for the first exposure process in obtaining a resist pattern 60 shown in FIG. 15. As shown, an HT mask 3 for the first exposure is such that a light blocking pattern 44 and transmissive pattern 45 are formed alternately on the grating-pattern mask part M1, and a light blocking pattern 46 is formed on the whole surface of the standard-pattern mask part M2.

FIG. 17 illustrates an HT mask for the second exposure process in obtaining the resist pattern 60 shown in FIG. 15. As shown, in an HT mask 6 for the second exposure, a reduced light blocking pattern 86 reduced by the predetermined amount C from each side of the grating-pattern mask part M1 is formed on the grating-pattern mask part M1, and light blocking patterns 81 to 85 are formed on the standard-pattern mask part M2.

The light blocking patterns 81, 83 and 85 additionally include light blocking pattern extension parts 81c, 83c and 85c, respectively, extending from the boundary line LB2 between the grating-pattern mask part M1 and the standard-pattern mask part M2 toward the grating-pattern mask part M1 side by the predetermined amount C. As described above, the wiring width LW of the light blocking pattern extension parts 81c, 83c and 85c is set in view of the overlay tolerance and dimensional accuracy tolerance.

Figure 18:
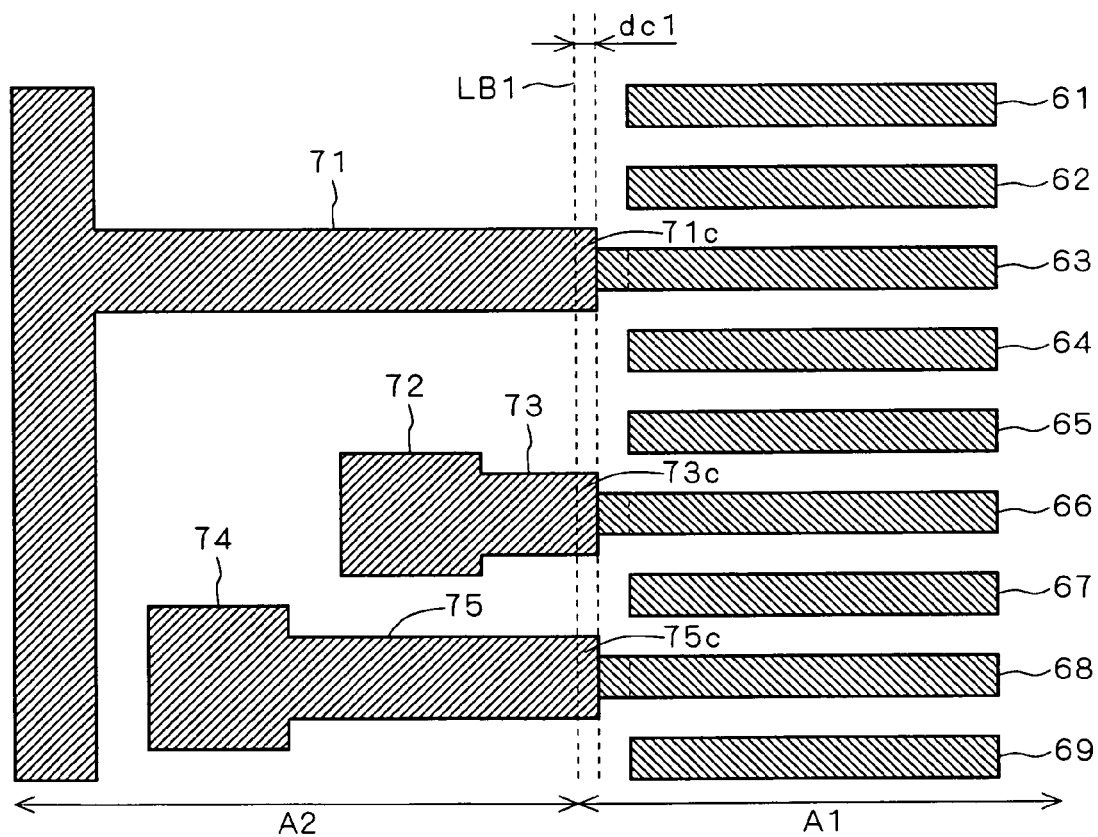
FIG. 18 illustrates a resist pattern obtained by a pattern forming method according to the second preferred embodiment, with the resist pattern shown in FIG. 15 as a desired pattern.

FIG. 18 illustrates a resist pattern obtained by the pattern forming method according to the second preferred embodiment, with the resist pattern 60 shown in FIG. 15 as a desired pattern. In FIG. 18, the edge recession phenomenon occurs with the amount of recession dc1 (<C).

As described above, the HT mask 6 includes the reduced light blocking pattern 86 reduced by the predetermined amount C, and the light blocking pattern extension parts 81c, 83c and 85c extending by the predetermined amount C, from the boundary line LB2 toward the grating-pattern mask part M1 side. Accordingly, unnecessary electric connection patterns (such as the unnecessary electric connection patterns 27 shown in FIG. 11 that are caused by the edge recession phenomenon) not located under the light blocking pattern extension parts 81c, 83c and 85c are completely erased during the second exposure process.

The result is that wiring pattern extension parts 71c, 73c and 75c are formed extending from the boundary line LB1 between the grating-pattern forming region A1 and the standard-pattern forming region A2 toward the grating-pattern forming region A1 side only by the amount of recession dc1, as shown in FIG. 18. The wiring pattern extension part 71c connects the wiring pattern 71 and line pattern 63, the wiring pattern extension part 73c connects the wiring pattern 73 and line pattern 66, and the wiring pattern extension part 75c connects the wiring pattern 75 and line pattern 68. Therefore, a pattern equivalent to the resist pattern 60 in FIG. 15 in terms of electrical connection relationship is obtained even in the event of the edge recession phenomenon.

Figure 19:
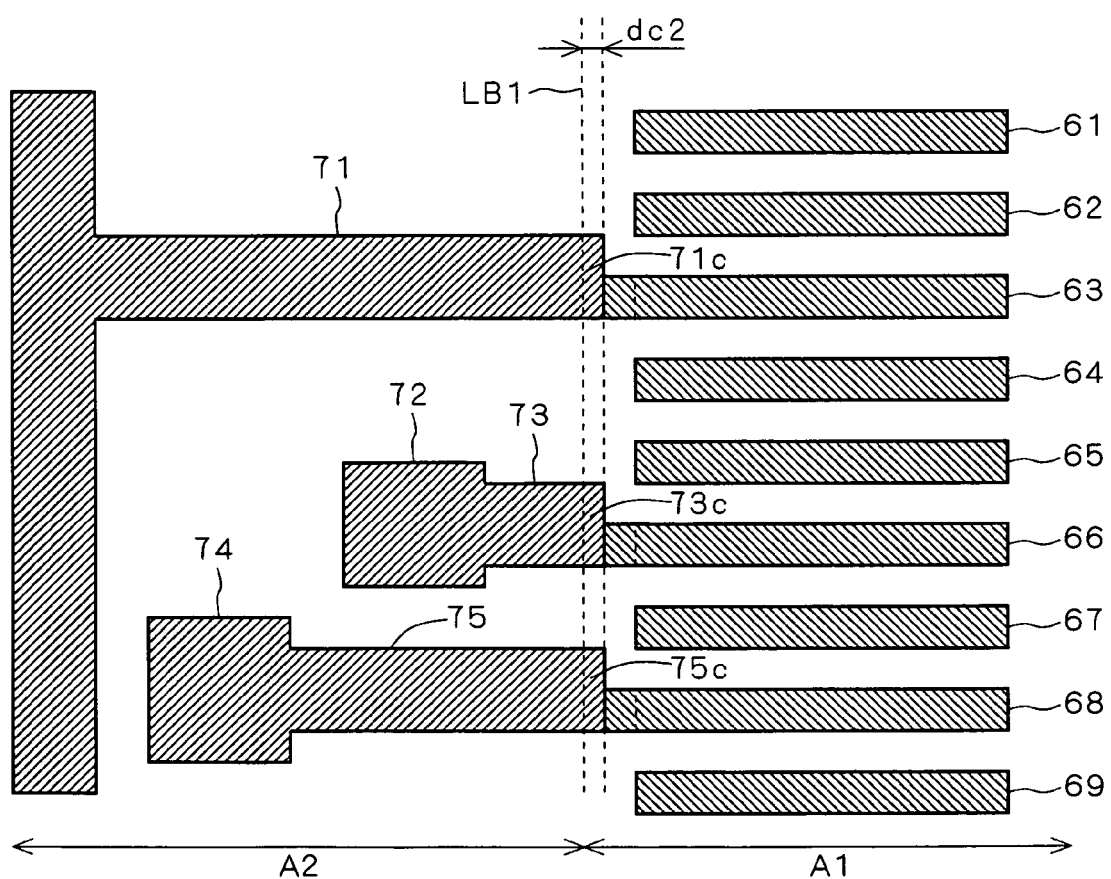
FIGS. 19 and 20 illustrate resist patterns obtained by pattern forming methods according to the second preferred embodiment.

FIG. 19 illustrates a resist pattern obtained by the pattern forming method according to the second preferred embodiment, where the mask overlay deviation phenomenon in a rightward-slanting direction occurs with the amount of deviation dc2 to the right.

As described above, the HT mask 6 includes the reduced light blocking pattern 86, and the light blocking pattern extension parts 81c, 83c and 85c. Accordingly, unnecessary patterns (which correspond to the unnecessary pattern 10 in FIG. 8) not located under the light blocking pattern extension parts 81c, 83c and 85c are completely erased during the second exposure process.

The result is that the wiring pattern extension parts 71c, 73c and 75c are formed extending from the boundary line LB1 toward the grating-pattern forming region A1 side only by the amount of deviation dc2, as shown in FIG. 19. The wiring pattern extension part 71c connects the wiring pattern 71 and line pattern 63, the wiring pattern extension part 73c connects the wiring pattern 73 and line pattern 66, and the wiring pattern extension part 75c connects the wiring pattern 75 and line pattern 68. Therefore, a pattern equivalent to the resist pattern 60 shown in FIG. 15 in terms of electrical connection relationship is obtained even in the event of the mask overlay deviation phenomenon in a rightward-slanting direction.

Moreover, because the wiring width LW of the light blocking pattern extension parts 81c, 83c and 85c is set wider than the forming width of the line patterns 61 to 69 in view of the overlay tolerance and dimensional accuracy tolerance, the line pattern 63 and wiring pattern extension part 71c, the line pattern 66 and wiring pattern extension part 73c, and the line pattern 68 and wiring pattern extension part 75c can respectively be connected with reliability even in the event of a overlay deviation in a vertical direction.

Figure 20:
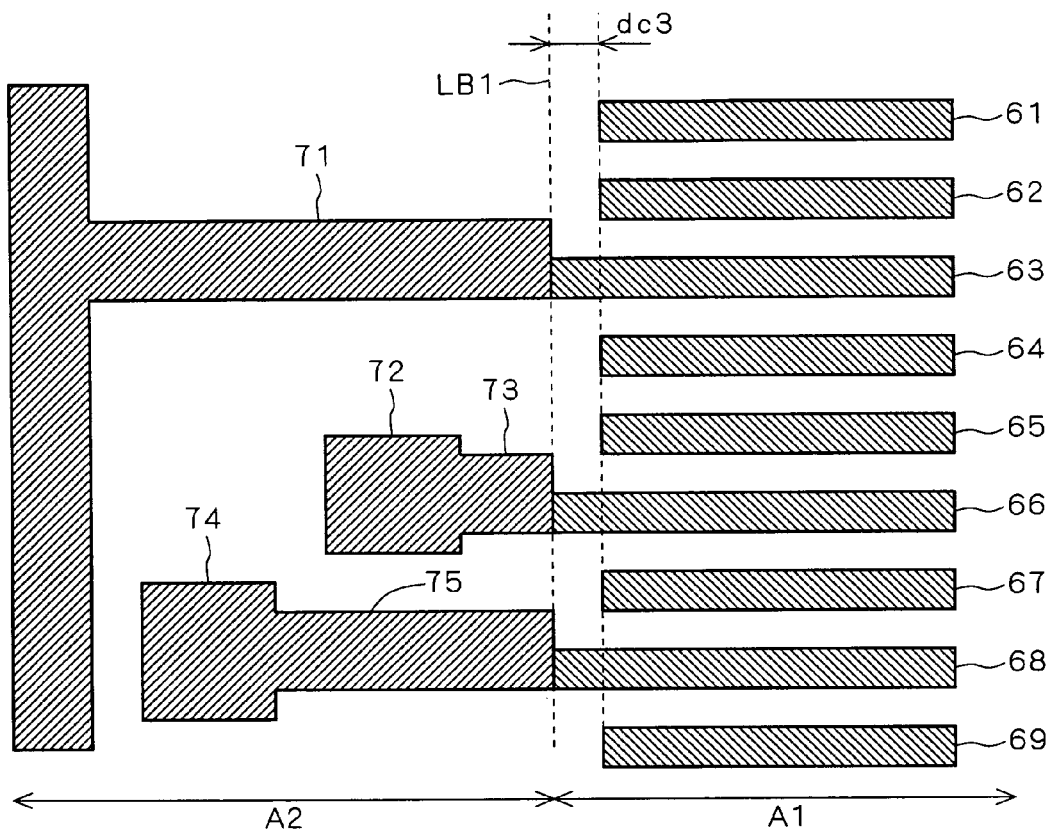

FIG. 20 illustrates a resist pattern obtained by the pattern forming method according to the second preferred embodiment, where the mask overlay deviation phenomenon in a leftward-slanting direction occurs with an amount of deviation dc3 to the left.

As described above, the HT mask 6 includes the reduced light blocking pattern 86, and the light blocking pattern extension parts 81c, 83c and 85c. Accordingly, unnecessary patterns (additionally extending parts of the line patterns 61, 62, 64, 65, 67 and 69 to the boundary line LB1) not located under the light blocking pattern extension parts 81c, 83c and 85c are completely erased during the second exposure process.

Moreover, because the wiring width LW of the light blocking pattern extension parts 81c, 83c and 85c is set wider than the forming width of the line patterns 61 to 69 in view of the overlay tolerance and dimensional accuracy tolerance, the line pattern 63 and wiring pattern 71, the line pattern 66 and wiring pattern 73, and the line pattern 68 and wiring pattern 75 can respectively be connected with reliability even in the event of a overlay deviation in a vertical direction.

Therefore, in the second preferred embodiment, an exposure mask set including the HT masks 1 and 3 for the first exposure and HT masks 4 and 6 for the second exposure is used so that a pattern including a grating pattern and standard pattern can be formed on the resist with high accuracy.

Third Preferred Embodiment (Premise)
Like the first preferred embodiment, the finally obtained grating pattern by the pattern forming method according to the second preferred embodiment is thinner than a resist pattern immediately after the first exposure process, and vertically deteriorated in resist shape. This is possibly the consequence of being subjected to half-tone transmitted light through the second HT mask 6 used in the second exposure process. As a result, the contrast of a composite optical image of the first mask (during the first exposure process) and the second mask (during the second exposure process) deteriorates, further causing deterioration in line edge roughness (straightness of wiring). Improvements are made to these deteriorations in a third preferred embodiment of this invention.

(General Process)
A general process is performed in the same fashion as the first preferred embodiment illustrated in FIG. 1, except the contents of the first exposure process at step S3 and the second exposure process at step S4.

Figure 21:
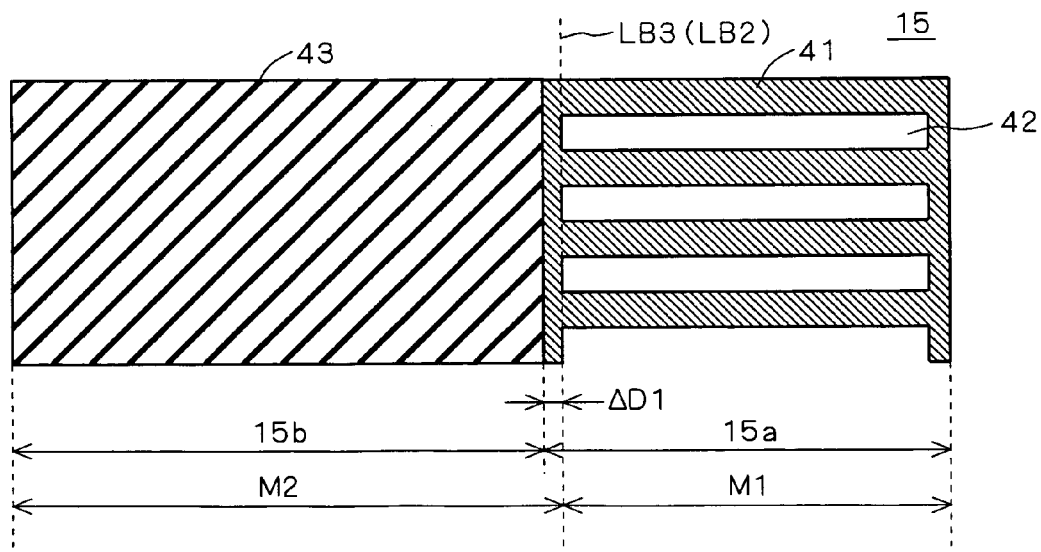
FIG. 21 illustrates the plane structure of a triton mask used in the first exposure process according to a third preferred embodiment of this invention.

FIG. 21 illustrates the plane structure of a triton mask 15 used in the first exposure process according to the third preferred embodiment.

As shown, the triton mask 15 for the first exposure process is the same in pattern shape itself as the HT mask 1 shown in FIG. 5 for the first exposure process according to the first and second preferred embodiments. That is, a light blocking pattern 41, transmissive pattern 42 and a light blocking pattern 43 of the triton mask 15 have the same shapes as the corresponding patterns of the HT mask 1.

The triton mask 15, however, differs from the HT mask 1 in including an HT mask part 15a, which is an incomplete light blocking part, and a complete light blocking part 15b.

The HT mask part 15a is formed as a region where the whole light blocking pattern 41 is formed, and extends from a boundary line LB3 between the light blocking patterns 43 and 41 by a shift amount $\Delta D1$ to be formed as part of the light blocking pattern 43 as well.

Meanwhile, the complete light blocking part 15b is formed as a region where the whole light blocking pattern 43 except the portion of the HT mask part 15a is formed. That is, the complete light blocking part 15b is formed on the whole standard-pattern mask part M2 except an adjacent region (boundary adjacent region) to the boundary line LB2 between the grating-pattern mask part M1 and standard-pattern mask part M2.

Like the HT mask 1, the HT mask part 15a includes a transmissive part (which corresponds to the transmissive pattern 42) transmitting high intensity light that contributes to exposure, and a light blocking part (which corresponds to the light blocking pattern 41) having a transmission factor of about 6% and inverting the phase of light being transmitted. The complete light blocking part 15b is a mask part that blocks light completely by covering a light blocking part equivalent to an HT mask further with Cr or the like.

(Second Exposure Process)

Figure 22:
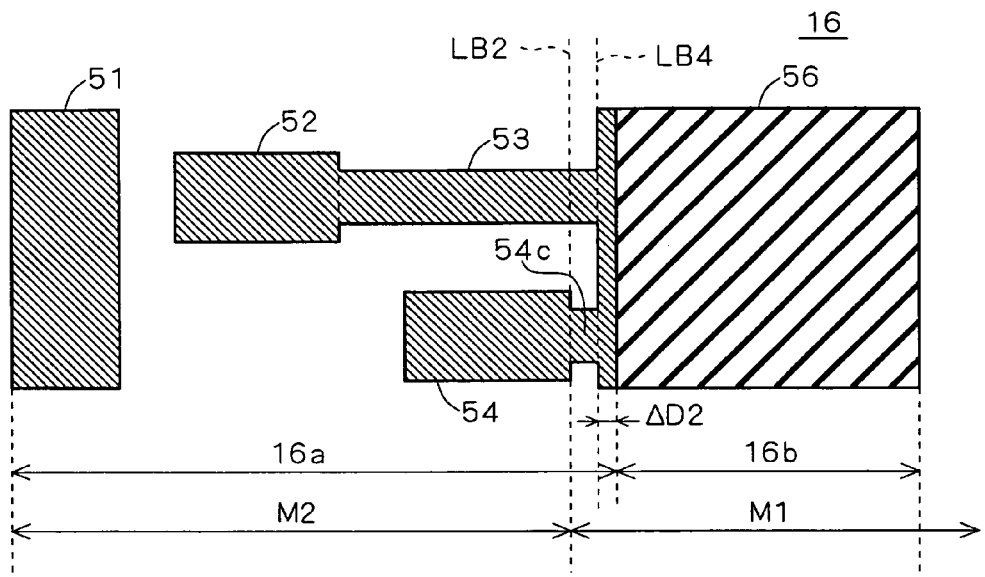
FIG. 22 illustrates the plane structure of a triton mask used in the second exposure process according to the third preferred embodiment.

FIG. 22 illustrates the plane structure of a triton mask 16 used in the second exposure process according to the third preferred embodiment.

As shown, the triton mask 16 for the second exposure process is the same in pattern shape itself as the HT mask 4 shown in FIG. 12 for the second exposure process according to the second preferred embodiment. That is, light blocking patterns 51 to 54 and 56 of the triton mask 16 have the same shapes as the corresponding patterns of the HT mask 4.

The triton mask 16, however, differs from the HT mask 4 in including an HT mask part 16a, which is an incomplete light blocking part, and a complete light blocking part 16b.

The HT mask part 16a is formed as a region where the whole light blocking patterns 51 to 54 are formed, and extends from a boundary line LB4 between the reduced light blocking pattern 56 and the light blocking pattern extension parts 53c, 54c by a shift amount ΔD2 to be formed as part of the reduced light blocking pattern 56 as well.

Meanwhile, the complete light blocking part 16b is formed as a region where the whole reduced light blocking pattern 56 except the portion of the HT mask part 16a is formed. That is, the complete light blocking part 16b is formed on the whole grating-pattern mask part M1 except an adjacent region to the boundary line LB2.

(Effect)

Figure 23:
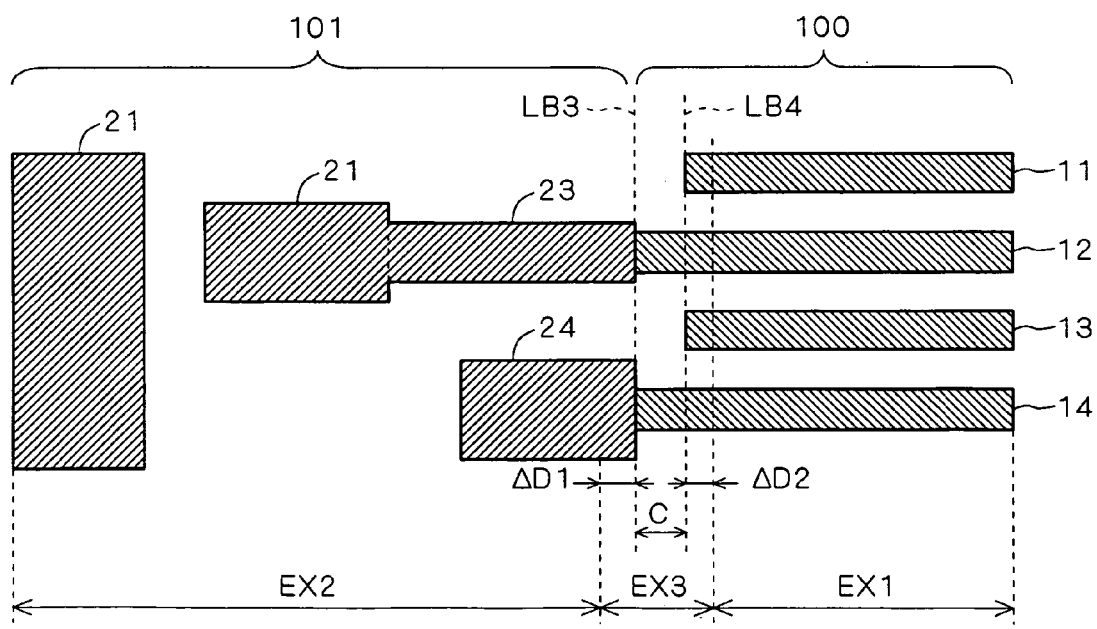
FIG. 23 illustrates the plane structure of a resist pattern obtained by a pattern forming method according to the third preferred embodiment.

FIG. 23 illustrates the plane structure of a resist pattern obtained by the pattern forming method according to the third preferred embodiment, schematically depicting observed results by an electron microscope.

As shown, it has been confirmed that the grating pattern 100 of 65 nm L/S and standard pattern 101 were subjected to patterning with high accuracy, and the line pattern 12 and wiring pattern 23, and the line pattern 14 and pad pattern 24 were respectively connected excellently. It was shown that the resist pattern obtained by the pattern forming method according to the third preferred embodiment has an excellent pattern shape without becoming thinner in dimension, or deteriorated in shape or in straightness like the resist patterns obtained by the methods according to the first and second preferred embodiments.

The effects of the third preferred embodiment are described with reference to FIG. 23. A region EX1 (region on the right side of the boundary line LB4 by the shift amount ΔD2 or more in FIG. 23) equivalent to the most part of the line patterns 11 to 14 is subjected to the first exposure process with the HT mask part 15a, and the second exposure process with the complete light blocking part 16b. Accordingly, no part of the region EX1 is subjected to light transmission during the second exposure process. This prevents the line patterns 11 to 14 in the region EX1 from being subjected to half-tone transmitted light, and allows the line patterns 11 to 14 to be obtained with high accuracy.

A region EX2 (region on the left side of the boundary line LB3 by the shift amount ΔD1 or more in FIG. 23) equivalent to the most part of the patterns 21 to 24 is subjected to the first exposure process with the complete light blocking part 15b, and the second exposure process with the HT mask part 16a. Accordingly, no part of the region EX2 is subjected to light transmission during the first exposure process. This prevents the patterns 21 to 24 in the region EX2 from being subjected to half-tone transmitted light, and allows the patterns 21 to 24 to be obtained with high accuracy.

A region EX3 equivalent to a connection region between the grating pattern 100 in the region EX1 and the standard pattern 101 in the region EX2 is subjected to the first exposure process with the HT mask part 15a, and the second exposure process with the HT mask part 16a. Accordingly, the region EX3 is subjected to two light transmissions through the light blocking parts. The effects of the region EX3 will be described later.

(First Mode)

The first and second exposure processes may be performed in other ways than those described above. A first mode is the pattern forming method described above that includes the first exposure process with the triton mask 15 shown in FIG. 21 and the second exposure process with the triton mask 16 shown in FIG. 22.

(Second Mode)

In a second mode, the first exposure process is performed with the triton mask 15 shown in FIG. 21, in the same fashion as the first mode.

Figure 24:
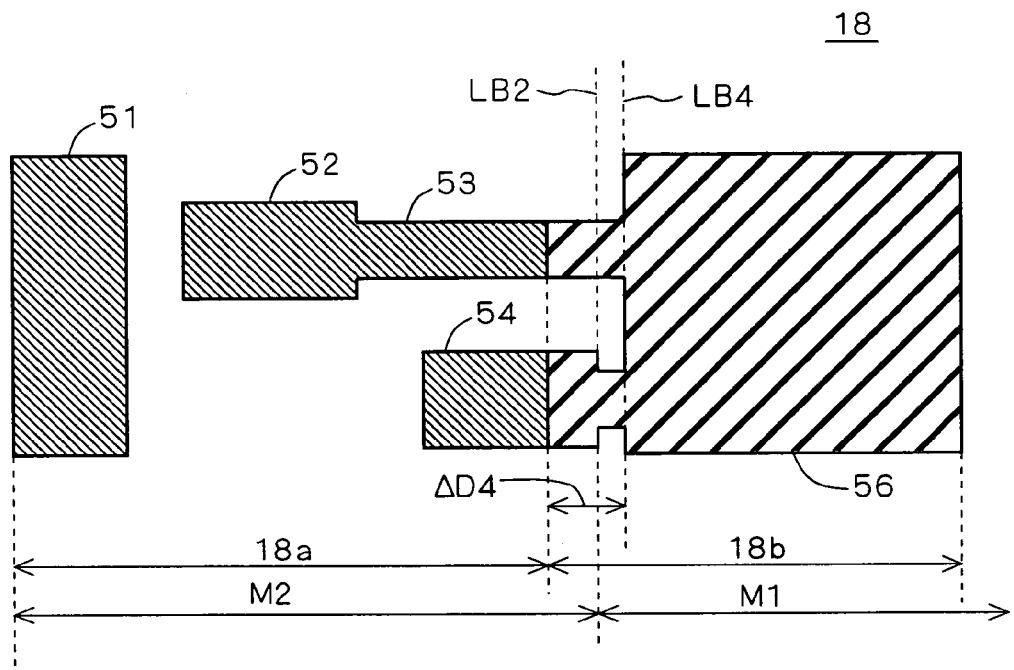
FIG. 24 illustrates a triton mask used in the second exposure process in a second mode according to the third preferred embodiment.

FIG. 24 illustrates a triton mask used in the second exposure process in the second mode according to the third preferred embodiment. As shown, a triton mask 18 for the second exposure process is the same in pattern shape itself as the HT mask 4 shown in FIG. 12 for the second exposure process according to the second preferred embodiment, like the first mode.

The triton mask 18, however, differs from the HT mask 4 in including an HT mask part 18a, which is an incomplete light blocking part, and a complete light blocking part 18b.

The complete light blocking part 18b is formed as a region where the whole reduced light blocking pattern 56 is formed, and extends from the boundary line LB4 between the reduced light blocking pattern 56 and the light blocking pattern extension parts 53c, 54c by a shift amount ΔD4 to be formed as parts of the light blocking patterns 53 and 54 as well. That is, the complete light blocking part 18b is formed as a light blocking pattern of the whole grating-pattern mask part M1 and an adjacent region to the boundary line LB2.

Meanwhile, the HT mask part 18a is formed as a region where the entire light blocking patterns 51 to 54 except the portion of the complete light blocking part 18b is formed.

The result is that the region EX3 shown in FIG. 23 is subjected to the first exposure process with the HT mask part 15a, and the second exposure process with the complete light blocking part 18b. Accordingly, like the region EX1, no part of the region EX3 is subjected to light transmission during the second exposure process. It is desired that the shift amount ΔD4 should be set a little wider than (the shift amount ΔD1+ the predetermined amount C) in order to prevent two light transmissions through the region EX3 with reliability.

(Third Mode)

Figure 25:
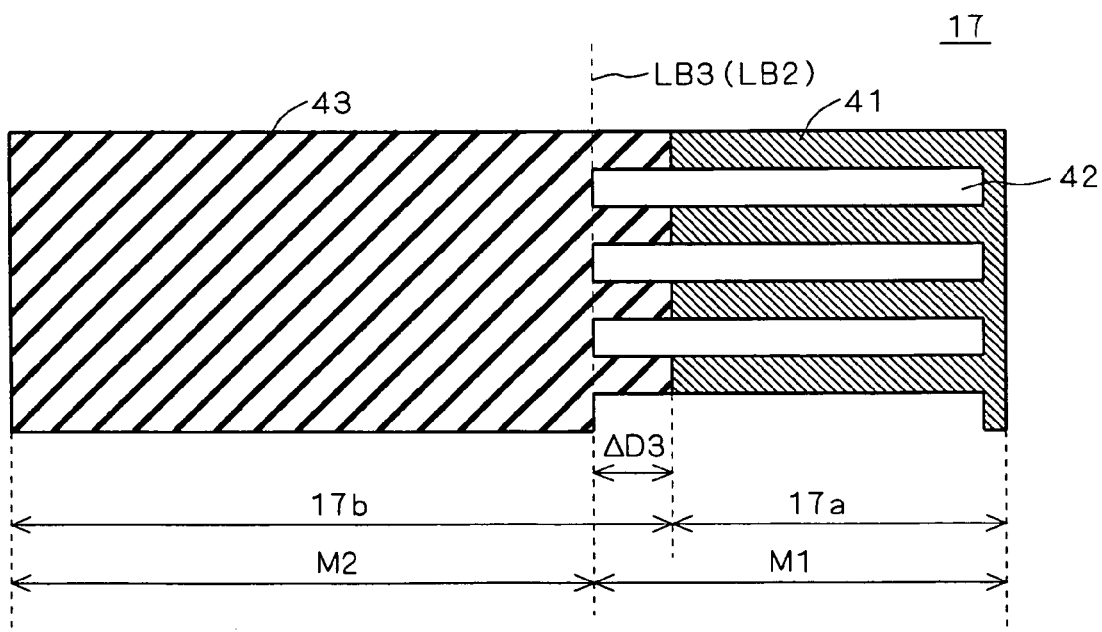
FIG. 25 illustrates a triton mask used in the first exposure process in a third mode according to the third preferred embodiment.

FIG. 25 illustrates a triton mask used in the first exposure process in a third mode according to the third preferred embodiment. As shown, a triton mask 17 for the first exposure process is the same in pattern shape itself as the HT mask 1 shown in FIG. 5 for the first exposure process according to the first and second preferred embodiments, in the same fashion as the first and second modes.

The triton mask 17, however, differs from the HT mask 1 in including an HT mask part 17a, which is an incomplete light blocking part, and a complete light blocking part 17b.

The complete light blocking part 17b is formed as a region where the whole light blocking pattern 43 is formed, and extends from the boundary line LB3 between the light blocking patterns 41 and 43 by a shift amount ΔD3 to be formed as part of the light blocking pattern 41 as well. That is, the complete light blocking part 17b is formed as a light blocking pattern of the entire standard-pattern mask part M2 and an adjacent region to the boundary line LB2.

Meanwhile, the HT mask part 17a is formed as a region where the entire light blocking pattern 41 except the portion of the complete light blocking part 17b is formed.

In the third mode, the second exposure process is performed with the triton mask 16 shown in FIG. 22, in the same fashion as the first mode.

The result is that the region EX3 shown in FIG. 23 is subjected to the first exposure process with the complete light blocking part 17b, and the second exposure process with the complete light blocking part 16b. Accordingly, like the region EX2, no part of the region EX3 is subjected to light transmission during the first exposure process. It is desired that the shift amount ΔD3 should be set a little wider than (the shift amount ΔD2+the predetermined amount C) in order to prevent two light transmissions through the region EX3 with reliability.

(Forming Accuracy of Connection Region)

Figure 26:
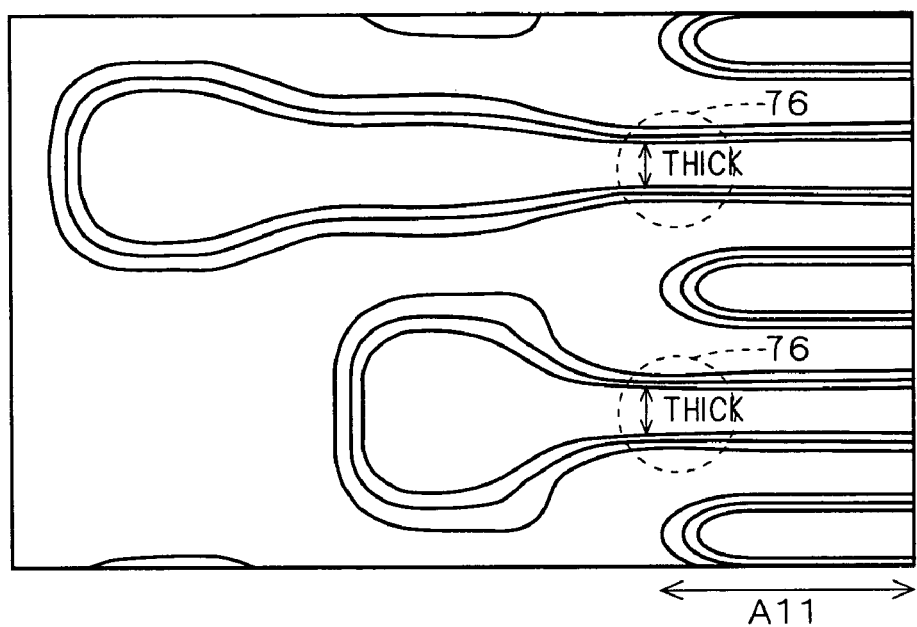
FIG. 26 illustrates an optical simulation result of a connection portion in a resist pattern obtained by a pattern forming method of a first mode according to the third preferred embodiment.
Figure 27:
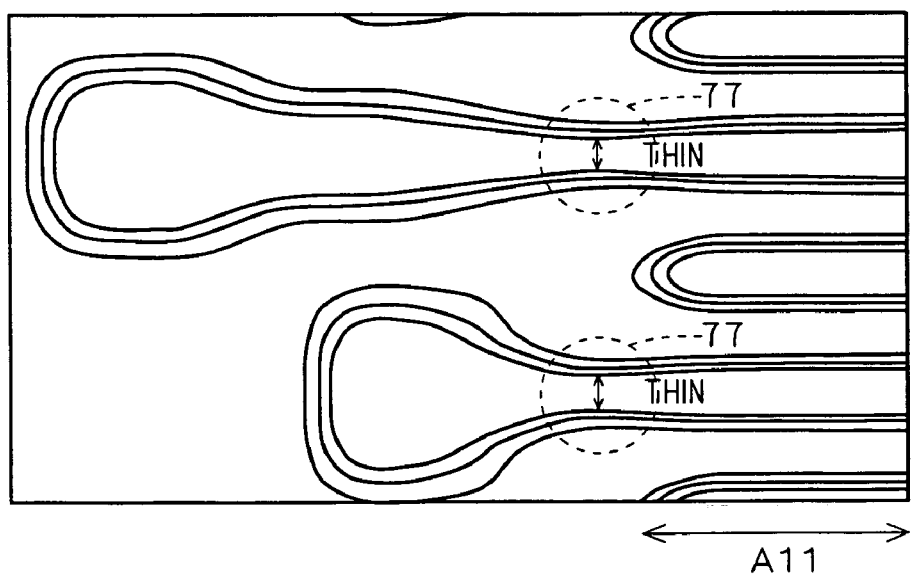
FIG. 27 illustrates an optical simulation result of a connection portion in a resist pattern obtained by a pattern forming method of the second mode according to the third preferred embodiment.
Figure 28:
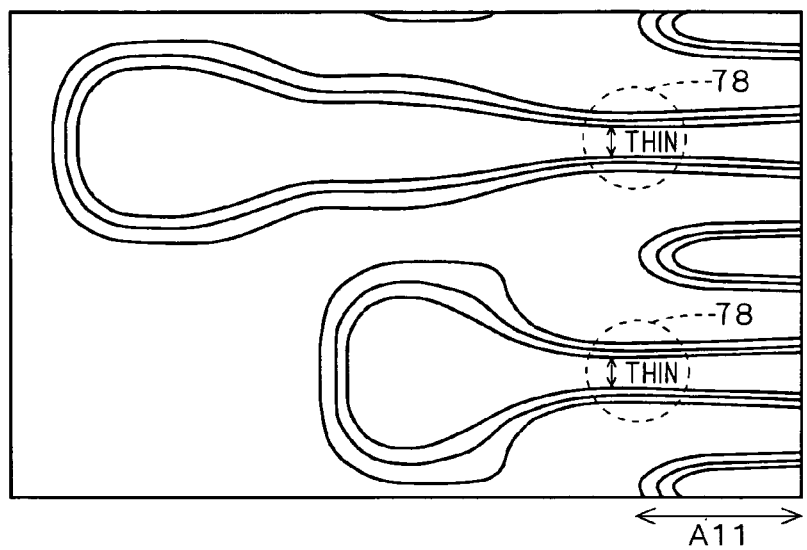
FIG. 28 illustrates an optical simulation result of a connection portion in a resist pattern obtained by a pattern forming method of the third mode according to the third preferred embodiment.

FIGS. 26 to 28 illustrate optical simulation results of connection regions (which correspond to the region EX3 shown in FIG. 23) of the respective resist patterns obtained by the pattern forming methods in the first to third modes according to the third preferred embodiment.

As shown, in a simulation result of FIG. 26 (first mode), a connection portion 76 corresponding to the wiring pattern extension parts 23c and 24c does not taper off in wiring width, but has a stable shape to almost the same degree as the forming width of the line patterns in a grating-pattern forming region A11. However, in simulation results of FIGS. 27 and 28 (second and third modes), connection portions 77 and 78 corresponding to the wiring pattern extension parts 23c and 24c taper off, and have unstable shapes.

It is confirmed from the above simulation results that, as for the connection region (which corresponds to the region EX3 shown in FIG. 23) between the grating pattern 100 and standard pattern 101, the first mode is most suitable where an HT mask part is used both in the first and second exposure processes, namely, where an HT mask part is used in an adjacent region to the boundary line LB2 both in the first and second exposure processes. This is due to the fact that optical image contrast is enhanced for fine patterns in the connection region by using an HT mask both in the first and second exposure processes.

As for the regions EX1 and EX2 that are subjected to substantially the same first and second exposure processes in the first to third modes, there is no difference between these two regions. Although the complete light blocking parts are effective when having a smaller transmission factor than the light blocking part having a transmission factor of about 6%, it is desired that the complete light blocking parts should block light completely (transmission factor of 0%).

(Fourth Mode)

Figure 29:
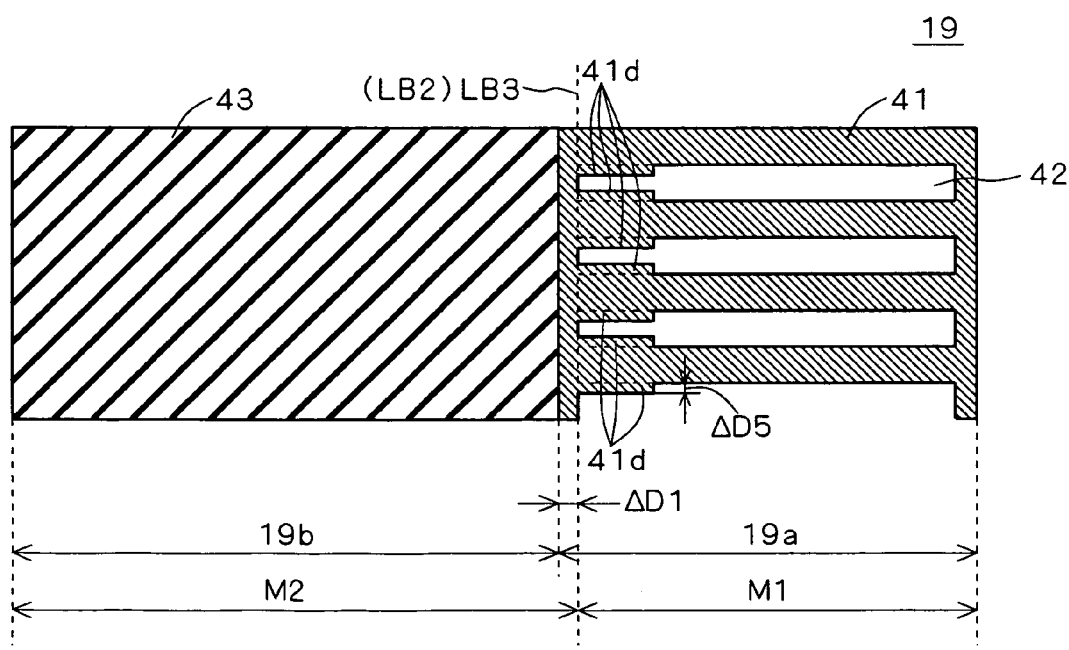
FIG. 29 illustrates a triton mask used in the first exposure process in a fourth mode according to the third preferred embodiment.

FIG. 29 illustrates a triton mask used in the first exposure process in a fourth mode according to the third preferred embodiment. As shown, a triton mask 19 for the first exposure process includes an HT mask part 19a, which is an incomplete light blocking part, and a complete light blocking part 19b. The relationship between the parts 19a and 19b is the same as that between the HT mask part 15a and complete light blocking part 15b of the triton mask 15 used in the first mode.

The triton mask 19 differs from the triton mask 15 in that the light blocking pattern 41 on the HT mask part 19a is increased in thickness by about 6 nm in total on its both sides to about 71 nm in an adjacent region to the boundary line LB3. That is, the triton mask 19 differs from the triton mask 15 in additionally providing light blocking pattern extension parts 41d each of which extends from one side of the light blocking pattern 41 toward the transmissive pattern 42 by about 3 nm. The remaining structure is the same as the triton mask 15, so the description thereof is omitted.

In the fourth mode, the second exposure process is performed with the triton mask 16 shown in FIG. 22, in the same fashion as the first mode.

In this manner, in the pattern forming method of the fourth mode according to the third preferred embodiment, the first and second exposure processes are performed with the triton masks 19 and 16, respectively. Therefore, the same effects as the first mode are obtained.

Further in the fourth mode, connection to the standard pattern 101 can be established with stability by partially increasing the forming width of the light blocking pattern 41 near the connection region to the standard pattern 101.

Therefore, in the third preferred embodiment, an exposure mask set including the HT masks 15, 17 and 19 for the first exposure and HT masks 16 and 18 for the second exposure is used so that a pattern including a grating pattern and standard pattern can be formed on the resist with high accuracy.

Application to First Embodiment

The first to fourth modes described above may be applied to the first preferred embodiment. In such cases, no part of the region EX1 equivalent to the most part of the line patterns 11 to 14 is subjected to light transmission during the second exposure process. This prevents the line patterns 11 to 14 in the region EX1 from being subjected to half-tone transmitted light, and allows the line patterns 11 to 14 to be obtained with high accuracy.

In addition, no part of the region EX2 equivalent to the most part of the patterns 21 to 24 is subjected to light transmission during the first exposure process. This prevents the patterns 21 to 24 in the region EX2 from being subjected to half-tone transmitted light, and allows the patterns 21 to 24 to be obtained with high accuracy.

In the first preferred embodiment, the first mode where an HT mask part is used for the connection region (which corresponds to the connection region A3 shown in FIG. 2) both in the first and second exposure processes should be applied again to increase the possibility of enhancing optical image contrast, as in the second preferred embodiment.

Fourth Preferred Embodiment

Figure 30:
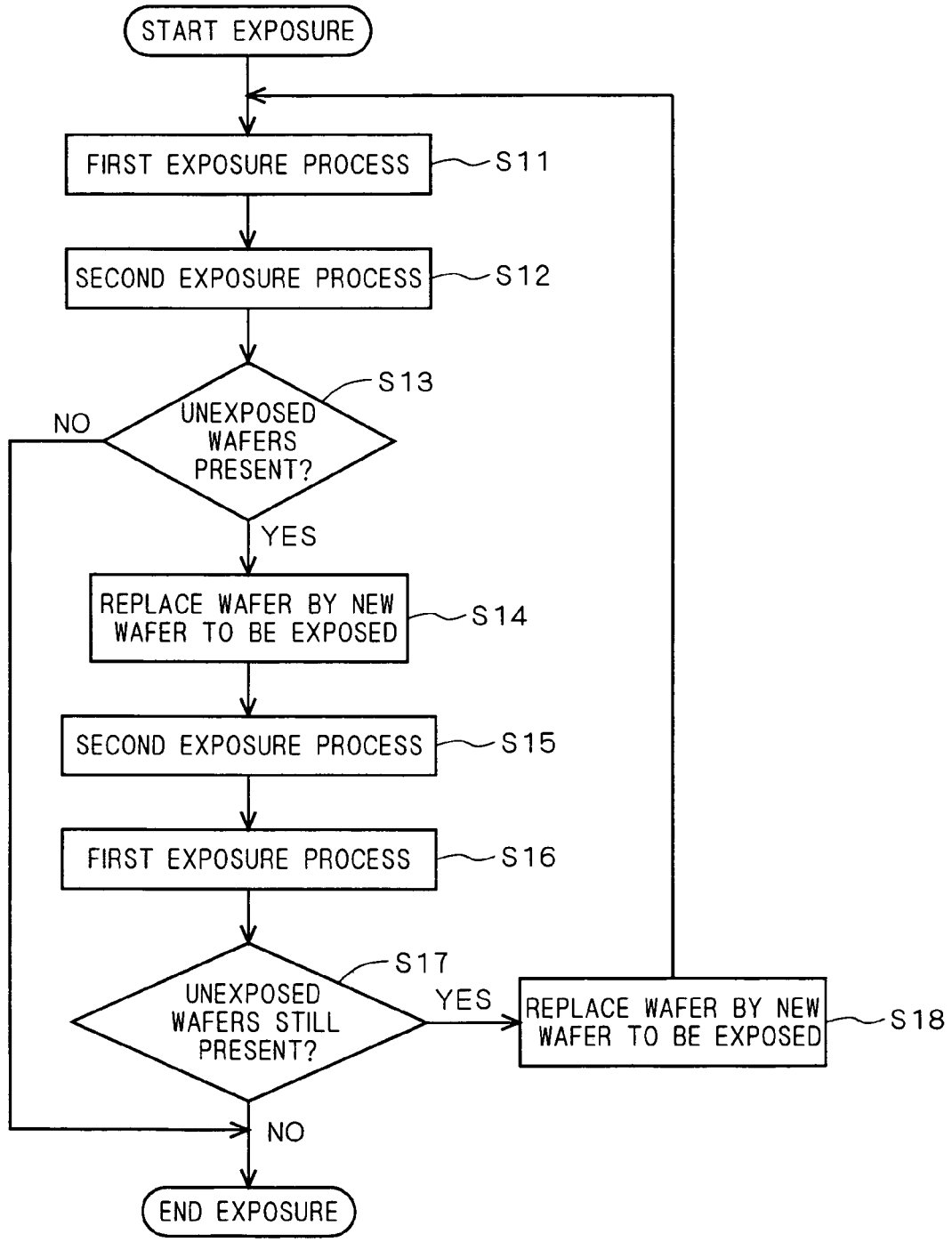
FIG. 30 illustrates a flow chart for an exposure method to be performed on a plurality of wafers according to a fourth preferred embodiment of this invention.

FIG. 30 illustrates a flow chart for an exposure method to be performed on a plurality of wafers according to a fourth preferred embodiment of this invention. A general process is performed in the same fashion as the first preferred embodiment illustrated in FIG. 1, except that this method is performed on a plurality of wafers (predetermined substrate of each wafer) and that the steps S3 and S4 are performed as shown in FIG. 30.

For convenience of explanation, the first exposure process with the HT mask 1 and the second exposure process with the HT mask 4 will be described as an example in the fourth preferred embodiment.

Turning to FIG. 30, at step S11, the first exposure process with the HT mask 1 is performed on (a predetermined substrate of) a first wafer to be exposed. Then, at step S12, the HT mask 1 is exchanged for the HT mask 4, and the second exposure process with the HT mask 4 is performed on the first wafer to be exposed.

Processing then continues with step S13 where the presence or absence of unexposed wafers is checked, and then moves on to step S14 when they exist (YES), or is completed when they do not (NO).

At step S14, the first wafer is replaced by a new wafer to be exposed. That is, one of the unexposed wafers is mounted on an exposure device as a second wafer to be exposed.

Then, at step S15, the second exposure process is performed on (a predetermined substrate of) the second wafer to be exposed by successively using the HT mask 4 that was used in step S12 and has not been exchanged. Then, at step S16, the HT mask 4 is exchanged for the HT mask 1, and the first exposure process with the HT mask 1 is performed on the second wafer to be exposed.

Processing then continues with step S17 where the presence or absence of unexposed wafers is checked, and then moves on to step S18 when they exist (YES), or is completed when they do not (NO).

At step S18, the second wafer is replaced by a new wafer to be exposed. That is, one of the unexposed wafers is mounted on the exposure device as a third wafer to be exposed.

Processing then returns to step S11 where the first exposure process is performed on (a predetermined substrate of) the third wafer to be exposed by successively using the HT mask 1 that was used in step S16 and has not been exchanged. Then, at step S12, the HT mask 1 is exchanged for the HT mask 4, and the second exposure process with the HT mask 4 is performed on the third wafer to be exposed.

Steps S11 to S18 are repeated thereafter until the absence of unexposed wafers has been confirmed at step S13 or step S17.

In this manner, in the exposure method according to the fourth preferred embodiment, either one of the first and second exposure processes is performed successively on two successively exposed wafers. This requires only one exchange of masks for two-exposure processes (first and second exposure processes), resulting in a reduction in processing time required for mask exchange, which further results in a reduction in overall processing time of the pattern forming method for a plurality of wafers.

Each of the first and second exposure processes may in some instances include a plurality of exposure steps by a plurality of masks. When the second exposure process is done by first to third partial exposure steps (not in particular order), for example, step S12 should be performed by first, second and third partial exposure steps in this order, and step S15 should be performed by third, second and first partial exposure steps in this order. This results in a reduction in processing time required for mask exchanges between the partial exposure steps by the time required for a mask exchange at the third partial exposure step.

<Application to Semiconductor Device Manufacturing Method>

The pattern forming methods (including the case where the exposure method according to the fourth preferred embodiment is incorporated) described in the first to third preferred embodiments may be applied to semiconductor device manufacturing methods.

That is, semiconductor device manufacturing methods to which the pattern forming methods according to this invention are applied would include a first step of applying a resist to a semiconductor substrate surface or an object to be patterned inside the semiconductor substrate, a second step of subjecting the resist to patterning with one of the pattern forming methods according to the first to third preferred embodiments, and a third step of subjecting the object to be patterned to patterning with the patterned resist as a mask.

The result is that a pattern including a grating pattern and a standard pattern that are formed continuously with each other through a connection pattern can be formed on the object to be patterned with high accuracy.

<Others>

In the first to third preferred embodiments, the resist subject to the first and second exposure processes is made of a positive type resist material to obtain the convex grating pattern and standard pattern.

Alternatively, a chemically amplified negative type resist may be used to obtain the same effects as the first to third preferred embodiments in forming a trench-type wiring pattern.

Figure 31:
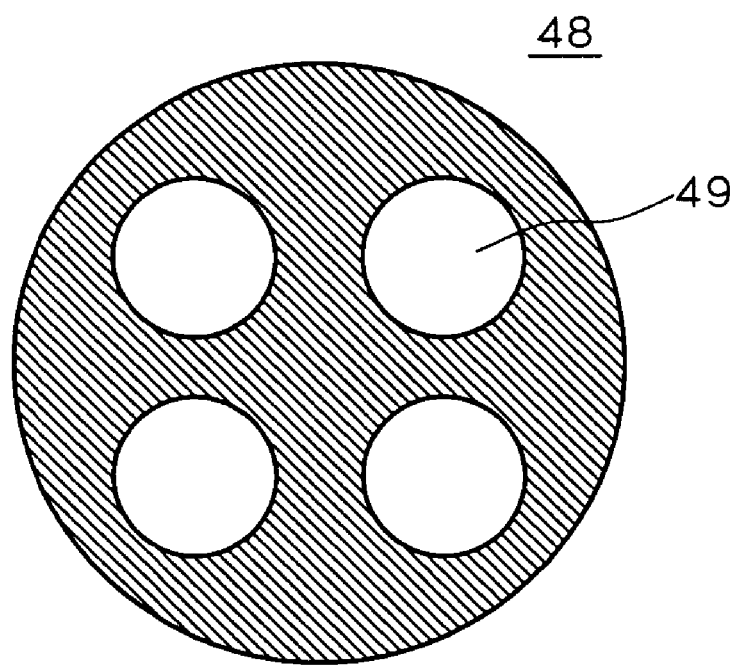
FIG. 31 depicts the structure of another illumination system stop used in the second exposure process.

FIG. 31 illustrates the structure of another illumination system stop used in the second exposure process. As shown, an illumination system stop 48 includes four circular openings 49. The use of this illumination system stop 48 allows for four-lens illumination.

In this manner, four-lens illumination may be used instead of the ⅔ annular illumination (see FIG. 6) as illumination for the second exposure process described in the first to fourth preferred embodiments.

While the invention has been shown and described in detail, the foregoing description is in all aspects illustrative and not restrictive. It is therefore understood that numerous modifications and variations can be devised without departing from the scope of the invention.

What is claimed is:

1. A pattern forming method on a resist formed on a predetermined substrate, said resist including adjacent first and second regions to be patterned, said method comprising the steps of:
   (a) performing a first exposure process with a first exposure mask using dipole illumination substantially on said first region of said resist, said first exposure mask having a repetition pattern in which a line and space are repeated alternately;
   (b) performing a second exposure process with a second exposure mask substantially on said second region of said resist, said second exposure mask having a standard pattern that is a pattern excluding said repetition pattern, said standard pattern at least partially including a connection pattern continuous with said repetition pattern; and
   (c) performing a development process on said resist having being subjected to said steps (a) and (b); wherein
   said first and second exposure masks each include first and second mask parts corresponding to said first and second regions of said resist, respectively,
   said first exposure mask is provided with a pattern for forming said repetition pattern on said first mask part, and a light blocking region on the whole surface of said second mask part, and
   said second exposure mask is provided with a pattern for forming said standard pattern on said second mask part, and an extension part of said connection pattern of said standard pattern and a light blocking region on said first mask part, said extension part being provided in a first extension region extending inwardly from a boundary line between said first and second mask parts by a first predetermined amount, said light blocking region being provided on the whole surface of a region excluding said first extension region and a second extension region, said second extension region extending inwardly from an edge line corresponding to an edge position of said pattern for forming said repetition pattern by a second predetermined amount.

2. The pattern forming method according to claim 1, wherein
said first and second exposure masks each include first and second mask parts corresponding to said first and second regions of said resist, respectively,
said first exposure mask is provided with a pattern for forming said repetition pattern on said first mask part, and a light blocking region on the whole surface of said second mask part, and
said second exposure mask is provided with a pattern for forming said standard pattern on said second mask part, and a light blocking region on the whole surface of said first mask part.

3. The pattern forming method according to claim 1, wherein
a direction in which said line in said repetition pattern is formed is defined as a first direction, and a direction orthogonal to said first direction is defined as a second direction, and
said first and second predetermined amounts include an amount in view of the amount of edge recession of a pattern for forming said space in said repetition pattern, and the amount of overlay deviation in said first direction between said first and second exposure masks of said steps (a) and (b).

4. The pattern forming method according to claim 3, wherein
a forming width of said extension part of said connection pattern is equivalent to the sum of a forming width of a pattern for forming said line in said repetition pattern and an amount in view of the amount of overlay deviation in said second direction between said first and second exposure masks of said steps (a) and (b) and the amount of dimensional accuracy tolerance.

5. The pattern forming method according to claim 1, wherein
said first and second exposure masks each include a transmissive part, a half-tone phase shift mask part transmitting light only at a predetermined ratio and inverting a phase of light being transmitted therethrough, and a light blocking part having a smaller transmission factor than said predetermined ratio,
said second mask part of said first exposure mask is formed at least of said light blocking part in a region excluding a boundary adjacent region between said first and second mask parts,
said first mask part of said second exposure mask is formed at least of said light blocking part in a region excluding said boundary adjacent region.

6. The pattern forming method according to claim 5, wherein
both of said first and second exposure masks are formed of said half-tone phase shift mask part in said boundary adjacent region.

7. The pattern forming method according to claim 6, wherein
said first exposure mask is locally widened in forming width in a region adjacent to said second mask part, with respect to a pattern corresponding to said line in said first mask part.

8. The pattern forming method according to claim 1, wherein
said predetermined substrate including a plurality of substrates classifiable by the wafer, and
said steps (a) and (b) are performed on said plurality of substrates in a changed sequence.

9. The pattern forming method according to claim 1, wherein
said resist includes a positive type resist.

10. The pattern forming method according to claim 1, wherein
said repetition pattern includes a first partial repetition pattern in which a line and space are repeated in a first direction and a second partial repetition pattern in which a line and space are repeated in a second direction orthogonal to said first direction, and
said first exposure mask includes first and second partial repetition pattern masks having said first and second partial repetition patterns,
said step (a) comprising the steps of:
(a-1) performing an exposure process with said first partial repetition pattern mask on said resist, under a first illumination condition using dipole illumination in which twin lenses are arranged in said first repetition direction; and
(a-2) performing an exposure process with said second partial repetition pattern mask on said resist, under a second illumination condition using dipole illumination in which twin lenses are arranged in said second repetition direction.

11. A semiconductor device manufacturing method, comprising the steps of:
(a) forming a resist on a semiconductor substrate or an object to be patterned inside said semiconductor substrate;
(b) patterning said resist using a pattern forming method on a resist formed on a predetermined substrate comprising the steps of:
(b1) performing a first exposure process with a first exposure mask using dipole illumination substantially on said first region of said resist to be patterned, said first exposure mask having a repetition pattern in which a line and space are repeated alternately;
(b2) performing a second exposure process with a second exposure mask substantially on a second region of said resist to be patterned, said second exposure mask having a standard pattern that is a pattern excluding said repetition pattern, said standard pattern at least partially including a connection pattern continuous with said repetition pattern; and
(b3) performing a development process on said resist having being subjected to said steps (b1) and (b2); and
(c) patterning said object to be patterned with said resist having been patterned as a mask.

12. An exposure mask set comprising:
a first exposure mask including adjacent first and second mask parts, said first mask part having a repetition pattern in which a line and space are repeated alternately; and
a second exposure mask including first and second mask parts equivalent to said first and second mask parts of said first exposure mask, said second mask part having a standard pattern that is a pattern excluding said repetition pattern, at least part of said standard pattern including a connection pattern for being continuous with said repetition pattern, wherein said first exposure mask is provided with a light blocking region on the whole surface of said second mask part, said second exposure mask is provided with a light blocking region on at least part of said first mask part, said first and second exposure masks each include a transmissive part, a half-tone phase shift mask part transmitting light only at a predetermined ratio and inverting a phase of light being transmitted therethrough, and a light blocking part having a smaller transmission factor than said predetermined ratio, said second mask part of said first exposure mask is formed at least of said light blocking part in a region excluding a boundary adjacent region between said first and second mask parts, said first mask part of said second exposure mask is formed at least of said light blocking part in a region excluding said boundary adjacent region; wherein a direction in which said line in said repetition pattern is formed is defined as a first direction, and a direction orthogonal to said first direction is defined as a second direction, said second exposure mask is provided with an extension art of said connection pattern of said standard pattern and a light blocking region on said first mask part, said extension part being provided in a first extension region extending inwardly from a boundary line between said first and second mask parts by a first predetermined amount, said light blocking region being provided on the whole surface of a region excluding said first extension region and a second extension region, said second extension region extending inwardly from an edge line corresponding to an edge position of said pattern for forming said repetition pattern by a second predetermined amount;

said first and second predetermined amounts include an amount in view of the amount of edge recession of a pattern for forming said space in said repetition pattern, and the amount of overlay deviation in said first direction at the time of exposure using said first and second exposure masks, and a forming width of said extension part of said connection pattern is equivalent to the sum of a forming width of a pattern for forming said line in said repetition pattern and an amount in view of the amount of overlay deviation in said second direction at the time of exposure using said first and second exposure masks and the amount of dimensional accuracy tolerance.

13. The exposure mask set according to claim 12, wherein both of said first and second exposure masks are formed of said half-tone phase shift mask part in said boundary adjacent region.

* * * * *